(12) United States Patent
Richardson et al.

(10) Patent No.: US 9,129,666 B1
(45) Date of Patent: Sep. 8, 2015

(54) ROBUST COMMANDS FOR TIMING CALIBRATION OR RECALIBRATION

(75) Inventors: Wayne S. Richardson, Saratoga, CA (US); Wayne Frederick Ellis, Saratoga, CA (US); Yohan Usthavia Frans, Palo Alto, CA (US); Lawrence Lai, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 379 days.

(21) Appl. No.: 13/590,495

(22) Filed: Aug. 21, 2012

Related U.S. Application Data

(60) Provisional application No. 61/527,499, filed on Aug. 25, 2011.

(51) Int. Cl.
    *G11C 7/00* (2006.01)
    *G11C 7/22* (2006.01)

(52) U.S. Cl.
    CPC .................................... *G11C 7/22* (2013.01)

(58) Field of Classification Search
    CPC ............... G06F 1/10; G06F 1/12; G11C 7/22
    USPC .................... 711/105; 365/193; 713/300, 600
    See application file for complete search history.

(56) References Cited

U.S. PATENT DOCUMENTS

| | | | |
|---|---|---|---|
| 6,667,993 B1 * | 12/2003 | Lippett et al. ................. | 370/509 |
| 8,504,745 B1 * | 8/2013 | Fischaber et al. ............... | 710/66 |
| 8,516,188 B1 * | 8/2013 | Solomon et al. ............... | 711/105 |
| 8,526,249 B1 * | 9/2013 | Swanson ....................... | 365/193 |
| 8,565,033 B1 * | 10/2013 | Manohararajah et al. .... | 365/193 |
| 8,565,034 B1 * | 10/2013 | Lu et al. ......................... | 365/193 |
| 8,713,331 B2 * | 4/2014 | Kitagawa ....................... | 713/300 |
| 2004/0084537 A1 * | 5/2004 | Best ............................... | 235/492 |
| 2008/0204926 A1 * | 8/2008 | Blaum et al. ............... | 360/77.05 |
| 2010/0039875 A1 * | 2/2010 | Stott et al. ..................... | 365/193 |
| 2010/0220536 A1 | 9/2010 | Coteus et al. ................. | 365/193 |
| 2011/0199844 A1 * | 8/2011 | Miki et al. ..................... | 365/193 |
| 2011/0225445 A1 * | 9/2011 | Gower et al. ................. | 713/600 |
| 2011/0239031 A1 * | 9/2011 | Ware et al. .................... | 713/500 |
| 2012/0250433 A1 * | 10/2012 | Jeon .............................. | 365/193 |
| 2012/0300563 A1 * | 11/2012 | Kim et al. ..................... | 365/193 |
| 2013/0013878 A1 * | 1/2013 | Frans et al. ................... | 711/167 |

* cited by examiner

*Primary Examiner* — Chun Cao
*Assistant Examiner* — Aurel Prifti
(74) *Attorney, Agent, or Firm* — The Neudeck Law Firm, LLC

(57) ABSTRACT

A memory device is placed in a mode that redefines the command set used to control the memory device. This may occur either in anticipation of the memory system falling out of calibration, or after it has already fallen out of calibration. The redefined command set is designed such that it may be reliably received by the memory device at the specified rate even if the memory system has fallen out of calibration. The redefined command set is then used to issue command(s) to recalibrate one or more communication links such that they can exchange data, commands, and/or addresses at a specified rate. After recalibration, the memory device is returned to responding to the original command set.

49 Claims, 15 Drawing Sheets

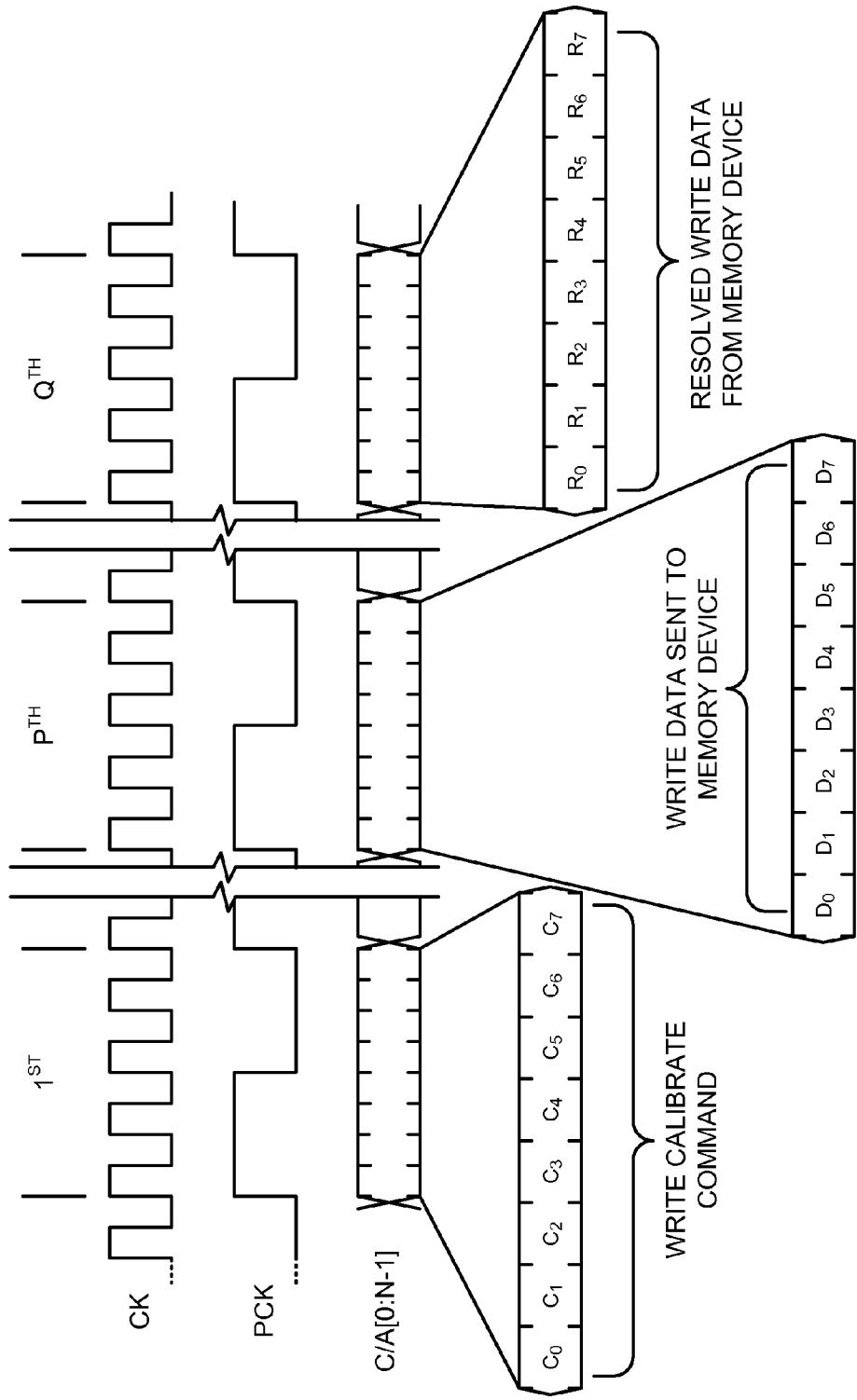

ROBUST COMMANDS FOR TIMING CALIBRATION OR RECALIBRATION

BRIEF DESCRIPTION OF THE DRAWINGS

FIG. 8A is a timing diagram illustrating signals exchanged during a write calibration.

DETAILED DESCRIPTION

Various embodiments described herein relate to a system including integrated circuit devices. The system may include, for example, memory devices and/or at least a memory controller device that controls such memory devices (and methods of operation of these respective devices). In several embodiments, as is described in more detail below, one or more communication links between a memory controller and a memory device are calibrated such that they can exchange data, commands, and/or addresses at a specified rate. The memory system may drift out of calibration such that it can no longer exchange data, commands and/or addresses at the specified rate. This may be due to a change in the thermal or electrical environment from a power-down period, idle period, or some other reason.

In an embodiment, a memory device is placed in a state that redefines the command set used to control the memory device. This may occur either in anticipation of the memory system falling out of calibration, or after the memory system has already drifted out of calibration. The redefined command set is designed such that it may be reliably received by the memory device at the specified rate, even if the memory system has drifted out of calibration. The redefined command set is also designed such that commands received by the memory device on a command bus are properly decoded and cannot inadvertently cause the loss of data stored by the memory device, even when the timing of the memory system has drifted out of calibration such that it can no longer reliably exchange information on the command bus at the specified rate. The redefined command set is used to issue command(s) to recalibrate the one or more communication links such that they can exchange data, commands, and/or addresses at the specified rate. After recalibration, the memory device is returned to responding to the original command set.

Figure 1:
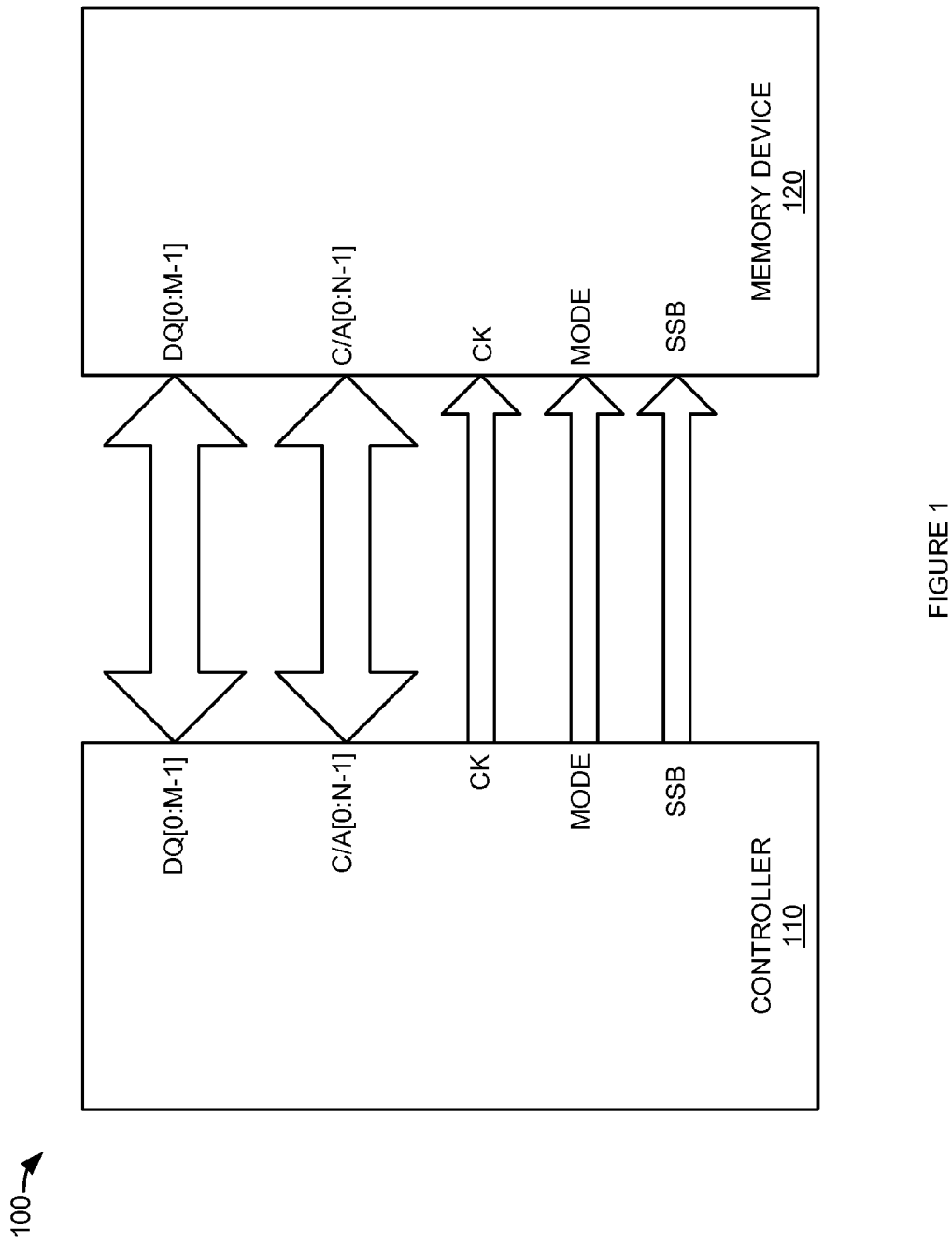
FIG. 1 is a block diagram illustrating a memory system.

FIG. 1 is a block diagram illustrating a memory system. In FIG. 1, memory system 100 comprises controller 110 and memory device 120. Controller 110 is operatively coupled to memory device 120. Controller 110 and memory device 120 are operatively coupled via a plurality of communication links. These communications links may comprise: a bidirectional data bus comprised of M signals, DQ[0:M−1]; a command/address bus comprised of N signals, C/A[0:N−1]; one or more timing reference signals, CK; one or more power mode signals, MODE; and, optionally, a sideband (or slow sideband) communication link, SSB. The SSB link is configured to operate reliably when memory system 100, controller 110, and/or memory device 120 have not been calibrated and/or have drifted out of calibration.

Controller 110 and memory device 120 are integrated circuit type devices, such as those commonly referred to as "chips". A memory controller, such as controller 110, manages the flow of data going to and from memory devices. Functionality of a memory controller may be included on a single die with a microprocessor, or included as part of a more complex integrated circuit system as a block of a system on a chip (SOC). For example, a memory controller may be a northbridge chip, an application specific integrated circuit (ASIC) device, a load-reduction memory buffer, a graphics processor unit (GPU), a system-on-chip (SoC) or an integrated circuit device that includes many circuit blocks such as ones selected from graphics cores, processor cores, and MPEG encoder/decoders, etc.

Although a single memory device 120 is shown in FIG. 1, there may be multiple memory devices or chips disposed on a memory module and coupled to the controller 110 via a connector interface. Memory device 120 can include a dynamic random access memory (DRAM) core. Memory device 120 may include other types of memory cores. For example, memory device 120 may include static random access memory (SRAM) cores, or non-volatile memory cores such as flash. Controller 110 and memory device 120 may be interconnected with each other in a variety of system topologies including on a PC board (e.g., where memory device 120 is on a module and controller 110 is socketed to the PC board, or in "die-down" arrangement where one or both of the chips are soldered to the PC board), stacked one on top of another and encapsulated in a single package or each having separate package (package-on-package), both disposed on a shared substrate, on an interposer, or even in a direct-attach arrangement. In addition, although the embodiments presented herein describe a memory controller and one or more memory devices, the instant apparatus and methods may also apply to chip interfaces that effectuate signaling between any two separate integrated circuit devices.

In an embodiment, the one or more MODE signals may control memory device 120 to switch between one or more low-power states, and an active state. For example, the one or more MODE signals may control memory device 120 to switch between: (1) a deep power down state where only leakage current is consumed by memory device 120; (2) a power down state where many, if not all, input/output (I/O) circuitry is turned off and only a minimal part of the clock distribution circuitry is turned on; (3) an idle state where the distribution of clocks is paused; and, (4) all of the circuitry is active including the interfaces to controller 110. Controller 110 may also switch between low-power and active states (such as states 1-4, above.) In an embodiment, controller 110 and memory device 120 may communicate via interfaces that send and/or receive signals DQ[0:M−1], C/A[0:N−1], and one or more clock signals, CK. In order to communicate signal values between controller 110 and memory device 120 at a specified link rate (e.g., 4.3 Giga bits per second, per signal), controller 110 and/or memory device 120 may perform a calibration of a link. This calibration may include two steps, a read calibration and a write calibration. Taken from the perspective of controller 110, a read calibration involves steps to ensure signals sent by memory device 120 are received reliably, at the specified link rate, by controller 110. A write calibration involves steps to ensure signals sent to memory device 120, by controller 110, are received reliably by memory device 120, at the specified link rate. In an embodiment, read calibrations are performed before write calibrations. This ensures the signals sent by memory device 120 during a write calibration are reliably received, at the specified link rate, by controller 110.

For example, a read calibration of a link (e.g., DQ[0:M−1]) may include the steps of initiating the read calibration using a sideband communication link (e.g., SSB). Once initiated, memory device 120 may send a sequence of predetermined calibration data patterns on the link being calibrated to controller 110. Controller 110 resolves signal values on the link as it receives these calibration data patterns. In response to the resolved signal values, controller 110 may then adjust one or more internal or external timing references in order to reliably receive correctly resolved calibration data patterns. Controller 110 may adjust the delay (or phase, or time of arrival) of the one or more internal or external timing references in order to reliably receive the calibration data patterns. Controller 110 may adjust the duty cycle of the one or more internal or external timing references in order to reliably receive the calibration data patterns at the specified full-speed link rate. These internal or external timing references may be internal to controller 110, external to controller 110, internal to memory device 120, and/or external to memory device 120. When one or more internal or external timing references are adjusted such that memory device 120 and/or controller 110 reliably receives correctly resolved signal values at a specified full-speed link rate, the link is said to be "in calibration" or "calibrated."

A write calibration of a link (e.g., DQ[0:M−1]), for example, may include the steps of initiating the write calibration. The write calibration may be initiated using a command sent on the SSB link. Alternatively, the write calibration may be initiated using one or more of the C/A[0:N−1] links. Once initiated, controller 110 may send a sequence of calibration data patterns on the link being calibrated to memory device 120. Memory device 120 resolves signal values on the link as it receives these calibration data patterns. Memory device 120 may, at a predetermined time, send a sequence of signal values it resolved back to controller 110. Because a read calibration is typically performed prior to initiating the write calibration, the signals sent by memory device 120 during the write calibration are reliably received, at the specified link rate, by controller 110. In response to the signal values resolved by memory device 120, controller 110 may adjust one or more internal or external timing references in order to enable memory device 120 to reliably receive correctly resolved calibration data patterns. Controller 110 may adjust the delay (or phase, or time of arrival) of the one or more internal or external timing references in order to enable memory device 120 to reliably receive the calibration data patterns. Controller 110 may adjust the duty cycle of the one or more internal or external timing references in order to enable memory device 120 to reliably receive the calibration data patterns. Controller 110 may adjust the one or more internal or external timing references iteratively until memory device 120 reliably receives correctly resolved calibration data patterns.

In an embodiment, memory system 100 may perform several types of calibration sequences. These calibration sequences may differ from each other in the amount of timing error (i.e., the amount of delay and or duty cycle adjustment necessary to allow the calibration patterns, and thus data in normal, full-speed, operation, to be received reliably) that can be corrected, and the amount of time needed to perform the calibration sequence.

For example, memory system 100 may perform an initial calibration sequence. An initial calibration sequence may typically be performed when memory system 100 is first powered up. Of the types of calibration that are performed by memory system 100, the initial calibration sequence may be designed to correct the greatest amounts of timing error. Accordingly, the initial calibration sequence may require the most amount of time to perform.

Another type of calibration sequence memory system 100 may perform is a periodic timing calibration. A periodic calibration sequence may typically be performed in order to correct relatively small timing errors. These relatively small timing errors may not be large enough to cause a communication error on the link. Periodically correcting these relatively small timing errors ensures that changes in the operating environment (e.g., voltage and temperature) of memory system 100 over time do not eventually result in uncorrected (and larger) timing errors which become large enough to cause a communication error on the link. In an embodiment, periodic calibration is performed often enough that it only corrects timing errors that are so small they do not cause any communication errors. Because the periodic calibration sequence may be designed to correct small amounts of timing error, the periodic calibration sequence may require the least amount of time to perform. In an embodiment, a periodic calibration sequence may be performed while the link is idle. The link may be idle, for example, during a refresh operation of memory device 120.

In an embodiment, memory system 100 may also perform a timing calibration sequence that does not correct errors as large as the initial calibration sequence. This intermediate (or fast) timing calibration may be designed to minimize the time to calibrate the one or more links of memory system 100 after one or both of controller 110 and memory device 120 exit a low-power state and enter the active state. Thus, fast timing calibration is similar to the initial calibration, but since it does not attempt to correct as large a range of timing errors as the initial timing calibration corrects, the fast timing calibration takes less time to perform. Periodic and intermediate timing calibrations are typically performed after the initial timing calibration has been performed at least once. Thus, periodic and intermediate timing calibrations are typically performed after at full speed operation of the link has been established for a period of time.

In an embodiment, after at least one initial timing calibration, the C/A[0:N−1] and DQ[0:M−1] links are operated by memory system 100 at a specified full-speed rate. Links C/A[0:N−1] and/or DQ[0:M−1] may drift out of calibration. This may be due to changes in operating environment that occur while memory system 100 is in a low-power state. Links C/A[0:N−1] and/or DQ[0:M−1] may drift out of calibration because periodic calibration is not performed while memory system 100 is in a low-power state. In an embodiment, Links C/A[0:N−1] and/or DQ[0:M−1] may drift out of calibration because periodic calibration is not performed often enough, or enough times, while memory system 100 is in a low-power state, to keep Links C/A[0:N−1] and/or DQ[0:M−1] operating at the specified full-speed rate.

Controller 110 may send a command to memory device 120 to redefine (to a second command set from a first command set) the command set that memory device 120 will respond to when commands are received on C/A[0:N−1]. Controller 110 may send this command to memory device 120 C/A[0:N−1] before links C/A[0:N−1] may have drifted out of calibration. For example, controller 110 may send the command to memory device 120 prior to memory device 120 entering a low-power state. Controller 110 may send the command because periodic calibration will not be performed when memory device 120 is in the low-power state. This command may be sent at the specified full-speed rate. Controller 110 may send the command to memory device 120 via a sideband interface, SSB. Controller 110 may send this command to memory device 120 via the sideband interface after links C/A[0:N−1] may have drifted out of calibration.

The second command set may be configured to be reliably received at the specified full-speed link rate even though links C/A[0:N−1] have drifted out of calibration. Thus, while the C/A[0:N−1] command set is redefined, commands may be sent from controller 110 to memory device 120 via links C/A[0:N−1] with the expectation that the commands will be received, resolved, and correctly interpreted—even though links C/A[0:N−1] have drifted out of calibration. The second command set may be configured to be reliably received at the specified full-speed link rate even though links C/A[0:N−1] have drifted out of calibration by configuring the second command set to be reliably received while accommodating greater timing error than the original (normal operation) command set.

The second command set may be reliably received while accommodating greater timing error than the original command set by selecting an encoding that requires less strict timing tolerances (on the signals of the C/A[0:N−1] links) to distinguish any two commands in the second command set than the timing tolerances required to distinguish commands in the first command set. The second command set may be restricted in the number of commands that it supports. Limiting the number of commands supported by the second command set may further improve command recognition. Thus, the first command set and the second command set have different timing tolerances required in order to be received reliably by memory device 120. Accordingly, the second command set may be received and resolved correctly by memory device 120 when memory device 120's C/A[0:N−1] receivers and/or clocks are uncalibrated (i.e., not calibrated with sufficient accuracy that commands and/or data may be received and resolved correctly by memory device 120 at the full-speed link rate) by a timing error(s) that is greater than what is necessary to reliably receive the first command set. In an embodiment, the second command set may be selected such that controller 110 drivers and/or clock(s), or memory device 120's C/A[0:N−1] receivers and/or clock(s) may be uncalibrated by a timing error(s) that is greater than one bit time (at full-speed) of the C/A[0:N−1] links and memory device 120 will still be able distinguish any two commands in the second command set.

Controller 110 may use the second command set to initiate and perform one or more timing calibration sequences. These timing calibration sequences may include one or more of an initial timing calibration sequence, an intermediate timing calibration sequence, or a periodic timing calibration sequence. Each of these initial, intermediate, or periodic timing calibration sequences may include a read timing calibration and/or a write timing calibration. Thus, even though links C/A[0:N−1] have drifted out of calibration, memory system 100 is able to perform one or more timing calibration sequences in order to bring links C/A[0:N−1] and/or DQ[0:M−1] back into a calibrated state that allows full-speed operation of links C/A[0:N−1] and/or DQ[0:M−1].

A command in the second command set may be used by controller 110 to initiate and perform an intermediate timing calibration sequence. This intermediate calibration sequence may be performed in order to bring links C/A[0:N−1] and/or DQ[0:M−1] back into calibration. In particular, in order to ensure the first (original, not redefined) command set will be reliably received at the specified full-speed C/A[0:N−1] link rate, the second command set may be used by controller 110 to initiate and perform an intermediate write timing calibration.

The intermediate write timing calibration may include the steps of initiating the write calibration, or an individual step or stage of the write calibration, using the second command set. The command to initiate the write calibration (or an individual step or stage of the write calibration) using the second command set may be sent from controller 110 to memory device 120 at the specified full-speed link rate for C/A[0:N−1]. Once initiated, controller 110 may send a sequence of calibration data patterns on at least C/A[0:N−1] to memory device 120. Memory device 120 resolves signal values on at least C/A[0:N−1] as it receives these calibration data patterns. Memory device 120 may, at a predetermined time, send a sequence of signal values that it resolved on C/A[0:N−1] back to controller 110. This sequence of signal values may be sent back to controller 110, at the specified full-speed link rate, using the links of C/A[0:N−1].

In response to the signal values resolved by memory device 120, controller 110 may then adjust one or more internal or external timing references in order to enable memory device 120 to reliably receive correctly resolved calibration data patterns. Controller 110 may adjust the delay (or phase, or time of arrival) of the one or more internal or external timing references in order to enable memory device 120 to reliably receive the calibration data patterns. Controller 110 may adjust the duty cycle of the one or more internal or external timing references in order to enable memory device 120 to reliably receive the calibration data patterns. These internal or external timing references may be internal to controller 110, external to controller 110, internal to memory device 120, and/or external to memory device 120.

When the one or more internal or external timing references are adjusted such that memory device 120 reliably receives correctly resolved signal values sent by controller 110 at a specified full-speed link rate, the write direction of the link is calibrated. Thus, the intermediate write timing calibration may be deemed complete. After the intermediate write timing calibration is completed, controller 110 may send a command to memory device 120 to set the command set that memory device 120 will respond to when commands are received on C/A[0:N−1], back to the original (i.e., normal operation) command set.

Figure 2:
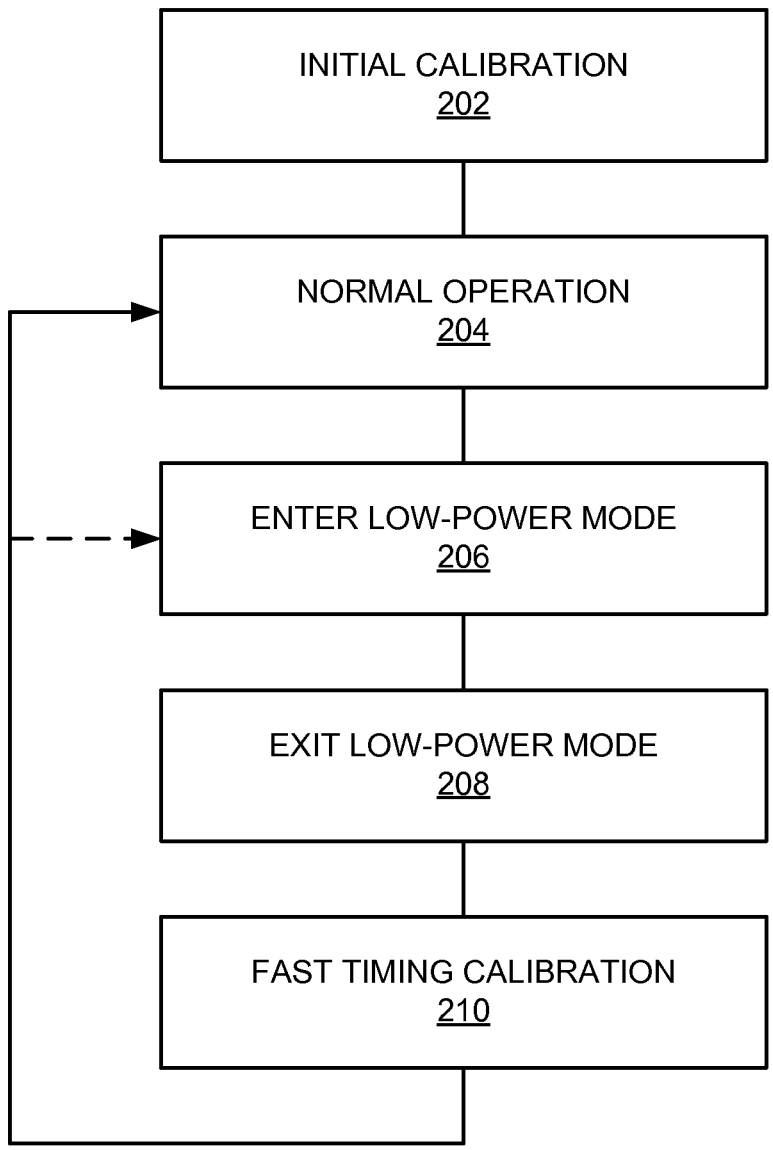
FIG. 2 is a flowchart illustrating a method of operating a memory system.

FIG. 2 is a flowchart illustrating a method of operating a memory system. The steps illustrated in FIG. 2 may be performed by one or more elements of memory system 100. An initial calibration is performed (202). For example, memory system 100, under the control of controller 110, may perform an initial calibration sequence to adjust one or more timing references in order to enable memory device 120 and controller 110 to reliably send and/or receive signal values on one or more of C/A [0:N−1] and DQ[0:M−1], at a specified full-speed link rate. Normal operation is entered (204). For example, after being calibrated by an initial calibration sequence, memory device 120 and controller 110 may exchange data, commands, and/or addresses at the specified full-speed link rate(s). Memory device 120 and controller 110 may each be in an active (i.e., not low-power) state.

A low-power mode is entered (206). For example, memory system 100 may save power by synchronously pausing one or more clock distribution networks. This may turn off clocks to circuitry in both controller 110 and memory device 120. Controller 110 may instruct memory device 120 to enter one of the low-power states described herein. Controller 110 may instruct memory device 120 to enter one of the low-power states via one or more MODE signals. Controller 110 may further instruct memory device 120 to respond to a second (or alternate) command set, described previously.

The low-power mode is exited (208). For example, memory system 100 may restart the one or more clock distribution networks paused previously. This may turn on clocks to circuitry in both controller 110 and memory device 120. Controller 110 may instruct memory device 120 to enter the active state described herein. Controller 110 may instruct memory device 120 to enter the active state via one or more MODE signals.

Fast timing calibration is performed (210). For example, memory system 100 may perform an intermediate timing calibration sequence in order to restore links C/A[0:N−1] and/or DQ[0:M−1] to a calibrated state after links C/A[0:N−1] and/or DQ[0:M−1] drifted out of calibration due to changes in the operating environment of memory system 100. These changes may have occurred while memory system 100 was in the low-power mode. After fast timing calibration is performed, normal operation may be resumed (box 204), or a low-power mode may be entered (box 206).

Figure 3:
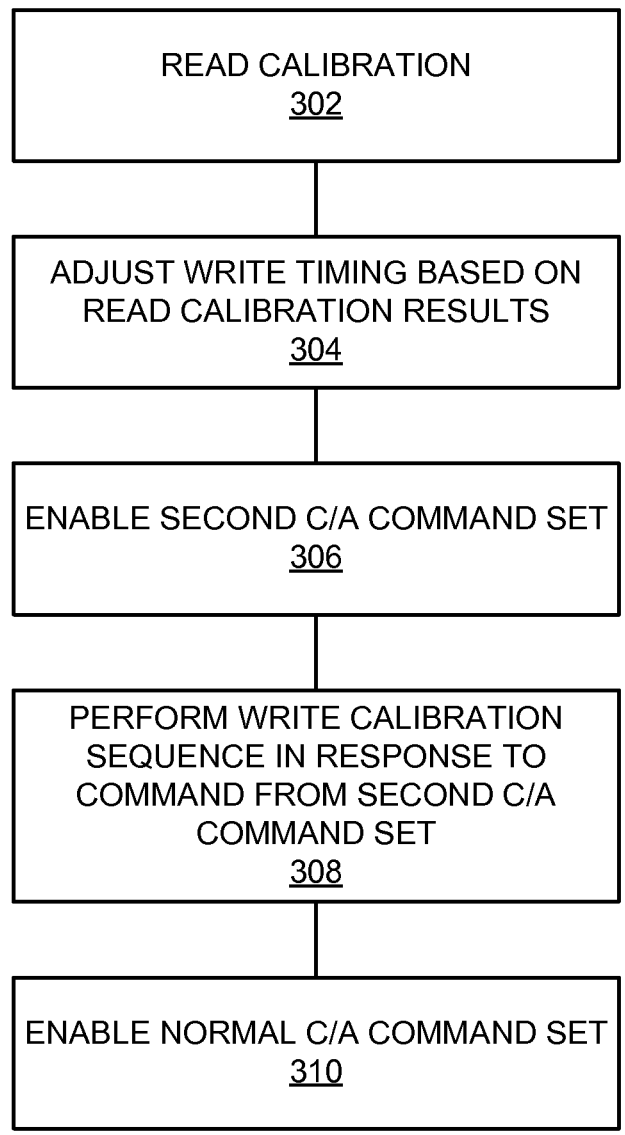
FIG. 3 is a flowchart illustrating a method of calibrating.

FIG. 3 is a flowchart illustrating a method of calibrating. The steps illustrated in FIG. 3 may be performed by one or more elements of memory system 100. For example, the steps illustrated in FIG. 3 may be part of an intermediate calibration sequence performed by memory system 100. In another example, the steps illustrated in FIG. 3 may be part of the fast timing calibration step of FIG. 2.

A read calibration is performed (302). A read calibration may involve steps to ensure signals sent by a memory device are received reliably, at a specified link rate, by a controller. For example, a read calibration of a link (e.g., C/A[0:N−1] of memory system 100) may include the steps of initiating the read calibration using a sideband communication link (e.g., SSB). Once initiated, memory device 120 may send a sequence of predetermined calibration data patterns on the link(s) being calibrated to controller 110. Controller 110 resolves signal values on the link as it receives these calibration data patterns. In response to the resolved signal values, controller 110 may adjust one or more internal or external timing references in order to reliably receive correctly resolved calibration data patterns. Controller 110 may adjust the delay, phase, time of arrival, duty cycle, and/or other aspects of the one or more internal or external timing references in order to reliably receive the calibration data patterns. These internal or external timing references may be internal to controller 110, external to controller 110, internal to memory device 120, and/or external to memory device 120.

The write timing is adjusted based on the read calibration results (304). In other words, delay, duty cycle, or other adjustments made during read calibration are used as a basis for adjustments to at least one internal or external timing reference used in the communication of signal values from controller 110 to memory device 120. For example, the delay and/or duty cycle adjustments (e.g., increased delay, shortened clock logic "high" time, etc.) made during read calibration of the one or more internal or external timing references may be duplicated on the one or more internal or external timing references used when signal values are sent from controller 110 to memory device 120. In another example, the delay and/or duty cycle adjustments made during read calibration of the one or more internal or external timing references may be approximated, scaled, or otherwise transformed and applied to the one or more internal or external timing references used when signal values are sent from controller 110 to memory device 120.

A second command/address (C/A) command set is enabled (306). For example, controller 110 may cause memory device 120 to enable a second set of commands (and disable a first set of commands) which, when any member of the second set of commands is received by memory device 120 on C/A[0:N−1], causes memory device 120 to perform an action (such as an intermediate calibration, a refresh, etc.). Because the C/A[0:N−1] links may be uncalibrated, controller 110 may use a sideband link (e.g., SSB) to enable the second command/address command set.

This command set may be configured to be reliably received at a specified full-speed link rate even though links C/A[0:N−1] have drifted out of calibration. The second command set may be reliably received with greater timing error than the original (normal operation) command set by selecting an encoding that requires less strict timing tolerances (on the signals of the C/A[0:N−1] links) to distinguish any two commands in the second command set than the timing tolerances required to distinguish commands in the normal command set. Thus, the normal command set and the second command set may require different timing tolerances in order to be received reliably by memory device 120. Accordingly, the second command set may be designed to be received and resolved correctly by memory device 120 when memory device 120's C/A[0:N−1] receivers and/or timing references are uncalibrated. For example, the second command set may be defined or selected such that one or more guard bits (i.e., bits that are adjacent to a critical bit transition, and/or are duplicates of a critical bit) are sent. The guard bits are designed to allow memory device 120 to distinguish any two commands in the second command set even when the links of C/A[0:N−1] are uncalibrated by one or more signal value intervals (i.e., unit intervals) of the C/A[0:N−1] links when operated at a specified full-speed link rate.

A write calibration sequence is performed in response to a command from the second C/A command set (308). For example, a command in the second command set may be sent by controller 110 to initiate and perform an intermediate timing calibration sequence which is to bring links C/A[0:N−1] and/or DQ[0:M−1] into calibration. The command from the second command set that initiates the intermediate write calibration may be sent from controller 110 to memory device 120 at the specified full-speed link rate of C/A[0:N−1]. Once initiated, controller 110 may send a sequence of calibration data patterns on at least C/A[0:N−1] to memory device 120. Memory device 120 resolves signal values as it receives the calibration data patterns. Memory device 120 may, at a predetermined time, send a sequence of signal values associated with the signal values that it resolved back to controller 110. This sequence of signal values may be sent back to controller 110 at the specified full-speed link rate, using the links on which memory device 120 received the calibration data patterns.

Controller 110 may then adjust one or more internal or external timing references based on the signal values resolved by memory device 120. Controller 110 may adjust the delay of the one or more internal or external timing references in order to enable memory device 120 to reliably receive the calibration data patterns. Controller 110 may adjust the duty cycle of the one or more internal or external timing references in order to enable memory device 120 to reliably receive the calibration data patterns. These internal or external timing references may be internal to controller 110, external to controller 110, internal to memory device 120, and/or external to memory device 120.

When the one or more internal or external timing references are adjusted such that memory device 120 reliably receives correctly resolved signal values at the specified full-speed link rate, the write direction of the link is calibrated. Thus, the intermediate write timing calibration may be deemed complete.

The normal command/address command set is enabled (310). For example, after the intermediate write timing calibration is completed, controller 110 may send a command (using the second command set, or a sideband) to memory device 120 to enable the normal (i.e., original) command set. Controller 110 may use a sideband link (e.g., SSB) to enable the normal command/address command set. In an embodiment, because the C/A[0:N−1] links are now calibrated in the write direction (i.e., from controller 110 to memory device 120), controller 110 may use a command from the second command set, sent on the C/A[0:N−1] links, to enable the normal command/address command set.

Figure 4:
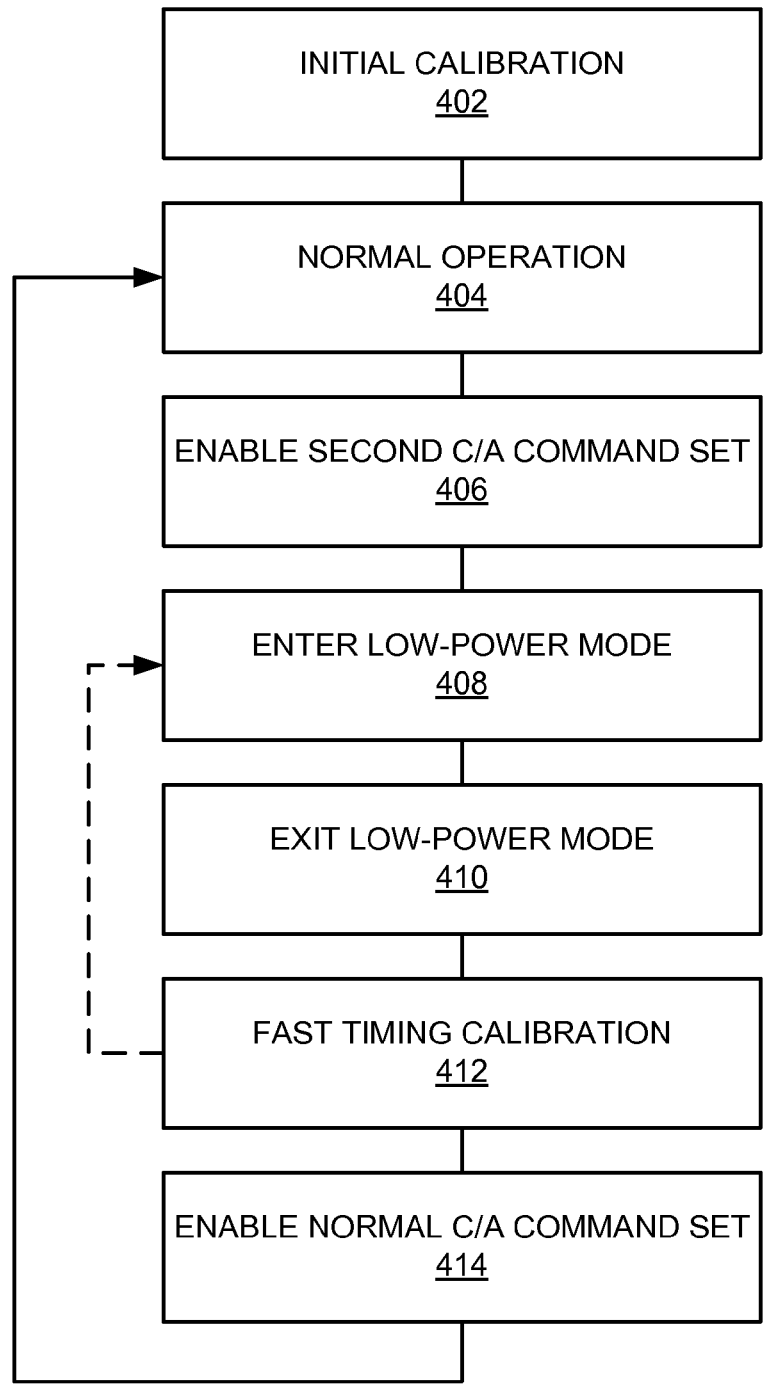
FIG. 4 is a flowchart illustrating a method of operating a memory system.

FIG. 4 is a flowchart illustrating a method of operating a memory system. The steps illustrated in FIG. 4 may be performed by one or more elements of memory system 100. An initial calibration is performed (402). For example, memory system 100 may perform an initial calibration sequence to adjust one or more timing references. The adjustments to these timing references may enable memory device 120 and controller 110 to reliably send and/or receive signal values on one or more of C/A [0:N−1] and DQ[0:M−1] at a specified full-speed link rate(s). Normal operation is entered (404). For example, after being calibrated by an initial calibration sequence, memory device 120 and controller 110 may exchange data, commands, and/or addresses at the specified full-speed link rate(s). Memory device 120 and controller 110 may each be in an active (i.e., not low-power) state.

A second command/address command set is enabled (406). For example, controller 110 may cause memory device 120 to enable a second set of commands (and disable the first set of commands) which, when any member of the second set of commands is received by memory device 120 on C/A[0:N−1], causes memory device 120 to perform an action (such as an intermediate calibration, a refresh, etc.). Controller 110 may use a command from the first (normal) set of commands sent via the C/A[0:N−1] links to enable the second command/address command set. As discussed herein, this second set of commands may be configured to be reliably received at a specified full-speed link rate even though links C/A[0:N−1] have drifted out of calibration.

A low-power mode is entered (408). For example, memory system 100 may save power by synchronously pausing one or more clock distribution networks. This may turn off clocks to circuitry in both controller 110 and memory device 120. Controller 110 may instruct memory device 120 to enter one of the low-power states described herein. Controller 110 may instruct memory device 120 to enter one of the low-power states via one or more MODE signals.

The low-power mode is exited (410). For example, memory system 100 may restart the one or more clock distribution networks paused previously. This will turn on clocks to circuitry in both controller 110 and memory device 120. Controller 110 may instruct memory device 120 to enter the active state described herein. Controller 110 may instruct memory device 120 to enter the active state via one or more MODE signals.

Fast timing calibration is performed (412). For example, memory system 100 may perform an intermediate timing calibration sequence in order to restore links C/A[0:N−1] and/or DQ[0:M−1] to a calibrated condition after links C/A[0:N−1] and/or DQ[0:M−1] drifted out of calibration due to changes in the operating environment of memory system 100 that occurred while memory system 100 was in the low-power mode. After fast timing calibration is performed, low-power mode may be re-entered (box 408).

Alternatively, after fast timing calibration is performed, the normal command/address command set may be enabled (414). After the normal command/address command set is enabled, normal operation may be resumed (box 404). For example, after the intermediate write timing calibration is completed, controller 110 may send a command (using the second command set, or a sideband) to memory device 120 to enable the normal command set that memory device 120 uses a majority of the time when in an active state. In an embodiment, controller 110 may use a command from the second command set, sent on the C/A[0:N−1] links, to enable the normal command/address command set.

Figure 5:
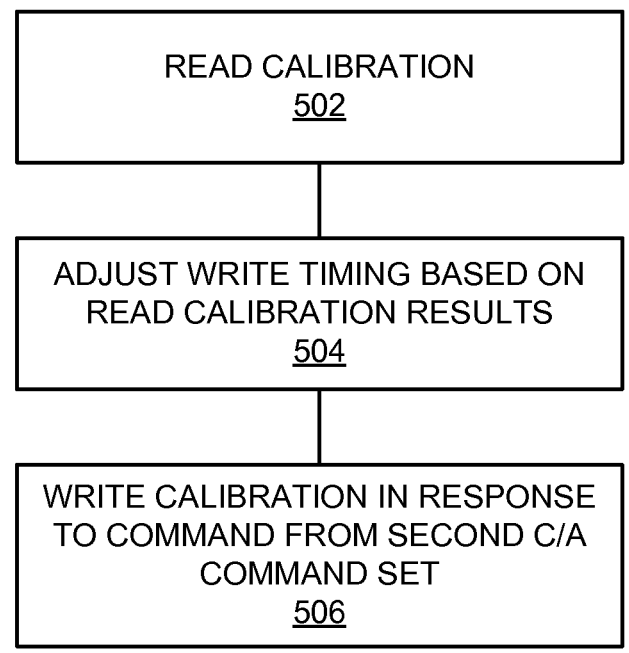
FIG. 5 is a flowchart illustrating a method of fast timing calibration.

FIG. 5 is a flowchart illustrating a method of fast timing calibration. The steps illustrated in FIG. 5 may be performed by one or more elements of memory system 100. For example, the steps illustrated in FIG. 5 may be part of an intermediate calibration sequence performed by memory system 100. In another example, the steps illustrated in FIG. 5 may be part of the fast timing calibration step of FIG. 4.

A read calibration is performed (502). As discussed herein, a read calibration may involve steps to ensure signals sent by a memory device are received reliably, at a specified link rate, by a controller. For example, a read calibration of a link (e.g., C/A[0:N−1] of memory system 100) may include the steps of initiating the read calibration using a sideband communication link, or a command on the links C/A[0:N−1]. In an embodiment, the read calibration may be triggered with a single pin command. For example, a read calibration sequence may be triggered on memory device 120 by a command in an alternate, or second, command set received on a single pin of C/A[0:N−1]. The other C/A[0:N−1] links may be held in a certain state, or ignored. Triggering a read command with a single pin command is described in more detail, below.

Once initiated, memory device 120 may send a sequence of calibration data patterns, on the link(s) being calibrated, to controller 110. Controller 110 resolves signal values on the links as it receives these calibration data patterns. In response to the resolved signal values, controller 110 may then adjust one or more internal or external timing references in order to reliably receive correctly resolved calibration data patterns. Controller 110 may adjust the delay or other aspect of the one or more internal or external timing references in order to reliably receive the calibration data patterns. These internal or external timing references may be internal to controller 110, external to controller 110, internal to memory device 120, and/or external to memory device 120.

Write timing is adjusted based on the read calibration results (504). In other words, the delay and/or duty cycle adjustments made during read calibration are used as a basis for adjustments to at least one internal or external timing reference used in the communication of signal values from controller 110 to memory device 120. For example, the delay and/or duty cycle adjustments made during read calibration of the one or more internal or external timing references used when signal values are sent from memory device 120 to controller 110 may be duplicated on the one or more internal or external timing references used when signal values are sent from controller 110 to memory device 120. In another example, the delay and/or duty cycle adjustments made during read calibration of the one or more internal or external timing references used when signal values are sent from memory device 120 to controller 110 may be approximated, scaled, or otherwise transformed and applied to the one or more internal or external timing references used when signal values are sent from controller 110 to memory device 120.

A write calibration sequence is performed in response to a command from the second C/A command set (506). For example, a command in the second command set may be sent by controller 110 to initiate and perform an intermediate timing calibration sequence to bring links C/A[0:N−1] and/or DQ[0:M−1] into calibration. The command from the second command set that initiates the intermediate write calibration may be sent from controller 110 to memory device 120 at the specified full-speed link rate of C/A[0:N−1]. Once initiated, controller 110 may send a sequence of calibration data patterns on at least C/A[0:N−1] to memory device 120. Memory device 120 resolves signal values as it receives the calibration data patterns. Memory device 120 may, at a predetermined time, send a sequence of signal values associated with the signal values that it resolved back to controller 110. This sequence of signal values may be sent back to controller 110 at the specified full-speed link rate using the links on which memory device 120 received the calibration data patterns.

Controller 110 may then adjust one or more internal or external timing references based on the signal values resolved by memory device 120. Controller 110 may adjust the delay of the one or more internal or external timing references in order to enable memory device 120 to reliably receive the calibration data patterns. Controller 110 may adjust the duty cycle of the one or more internal or external timing references in order to enable memory device 120 to reliably receive the calibration data patterns. These internal or external timing references may be internal to controller 110, external to controller 110, internal to memory device 120, and/or external to memory device 120.

When the one or more internal or external timing references are adjusted such that memory device 120 reliably receives correctly resolved signal values at the specified full-speed link rate, the write direction of the link is calibrated. Thus, the intermediate write timing calibration may be deemed complete.

Figure 6:
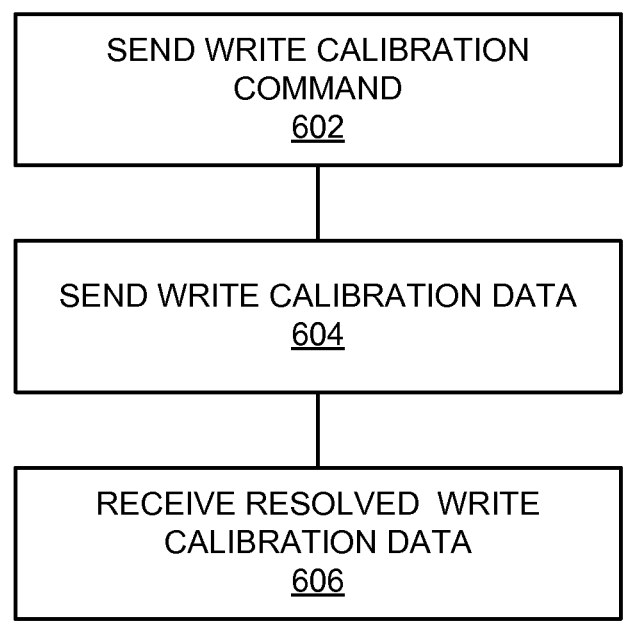
FIG. 6 is a flowchart illustrating steps of a write timing calibration.

FIG. 6 is a flowchart illustrating steps of a write timing calibration. The steps illustrated in FIG. 6 may be performed by one or more of the elements of memory system 100. In particular, the steps illustrated in FIG. 6 may be performed by controller 110.

A write calibration command is sent (602). For example, controller 110 may send a write calibration command to memory device 120 on links C/A[0:N−1]. The write calibration command may be sent as a command packet on links C/A[0:N−1]. The write calibration command may be encoded using a command set for the C/A[0:N−1] links that is configured to be reliably received at a specified full-speed link rate even though links C/A[0:N−1] have drifted out of calibration. For example, a write calibration of a link (e.g., C/A[0:N−1] of memory system 100) may include the steps of initiating the write calibration using a sideband communication link (e.g., SSB), or a command on the links C/A[0:N−1]. In an embodiment, the write calibration may be triggered with a single pin command (e.g., on one of C/A[0:N−1]). The write calibration command may be part of a series of write calibration commands used to perform an intermediate timing calibration sequence. The write calibration command may be sent to memory device 120 using a predetermined set of adjustments to one or more internal or external timing references used in the sending and/or receiving of signal values from controller 110 to memory device 120. The write calibration command may be sent to memory device 120 using a previously used set of adjustments (e.g., the set of adjustments used prior to starting the calibration sequence, or the set of adjustments used prior to sending the current calibration command) to the one or more internal or external timing references used in the sending of signal values from controller 110 to memory device 120.

Write calibration data is sent (604). For example, controller 110 may send write calibration data to memory device 120 on links C/A[0:N−1] and/or DQ[0:M−1]. The write calibration data sent to memory device may be sent using an experimental set of adjustments to one or more internal or external timing references. The experimental set of adjustments may be varied each time a write calibration command is sent in order to determine a set of adjustments that allow memory device 120 to reliably receive correctly resolved calibration data sent by controller 110. The write calibration data is typically sent a predetermined interval of time (i.e., clock cycles or packet cycles) after the write calibration command is sent.

Resolved write calibration data is received (606). For example, controller 110 may receive resolved signal values that memory device 120 sampled in response to the calibration command sent in box 602. Memory device 120 may sample and resolve the write calibration data sent in box 604. The signal values resolved by memory device 120 when sampling the write calibration data may be sent by memory device 120. These signal values may be received by controller 110. The signal values received by controller 110 may be used to determine a new experimental set of adjustments to be used the next time a write calibration command is sent by controller 110. The resolved write calibration data is typically sent by memory device 120 (and thus received by controller 110) a predetermined interval of time after the write calibration command is sent and/or the write calibration data is sent.

Figure 7:
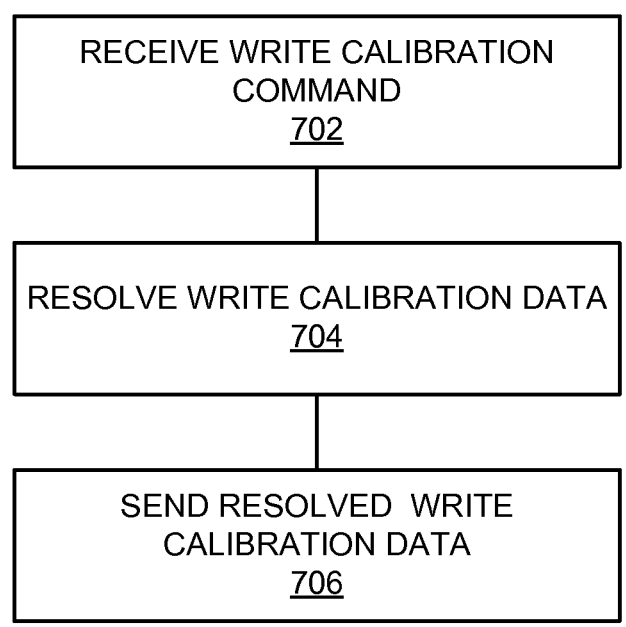
FIG. 7 is a flowchart illustrating steps of a write timing calibration.

FIG. 7 is a flowchart illustrating steps of a write timing calibration. The steps illustrated in FIG. 7 may be performed by one or more of the elements of memory system 100. In particular, the steps illustrated in FIG. 7 may be performed by memory device 120.

A write calibration command is received (702). For example, memory device 120 may receive a write calibration command from controller 110 on links C/A[0:N−1]. The write calibration command may be received as a command packet on links C/A[0:N−1]. The write calibration command may be encoded using a command set for the C/A[0:N−1] links that is configured to be reliably received by memory device 120 at a specified full-speed link rate even though links C/A[0:N−1] have drifted out of calibration.

The write calibration command received by memory device 120 may be part of a series of write calibration commands used to perform an intermediate timing calibration sequence. The write calibration command may be received by memory device 120 using a predetermined set of adjustments to one or more internal or external timing references used in the sending and/or receiving of signal values from controller 110 to memory device 120. The write calibration command may be received by memory device 120 using a previously used set of adjustments (e.g., the set of adjustments used prior to starting the calibration sequence, or the set of adjustments used prior to sending the current calibration command) to one or more internal or external timing references used in the sending and/or receiving of signal values from controller 110 to memory device 120.

Write calibration data is resolved (704). For example, controller 110 may send write calibration data to memory device 120 on links C/A[0:N−1] and/or DQ[0:M−1]. Using timing adjustments to one or more timing references set by controller 110, memory device 120 may sample and/or resolve signal values on links C/A[0:N−1] and/or DQ[0:M−1].

Resolved write calibration data is sent (706). For example, memory device 120 may send, to controller 110, resolved signal values that memory device 120 sampled in response to the calibration command received in box 702. The resolved write calibration data may be used to determine a new experimental set of adjustments to be used the next time a write calibration command is sent by controller 110. The resolved write calibration data is typically sent by memory device 120 (and thus received by controller 110) a predetermined interval of time after the write calibration command is received and/or the write calibration data is received.

FIG. 8A is a timing diagram illustrating signals exchanged during a write calibration. FIG. 8A illustrates exemplary timing and signals exchanged during the processes which are further illustrated in FIG. 6 and FIG. 7. In FIG. 8A, a first timing reference CK is shown periodically toggling at a stable cycle period. Each phase of CK corresponds to one bit period (a.k.a., unit interval) on the C/A[0:N−1] links. A second timing reference PCK is a divided by four (4) version of CK. The rising edges of PCK define a packet interval. In other words, a command/data unit of a packet on the C/A[0:N−1] links is defined to be from a rising edge of PCK to the following rising edge of PCK—a time span of, equivalently, four (4) CK cycles, eight (8) CK phases, or eight (8) unit intervals.

In FIG. 8A, the C/A[0:N−1] links are shown carrying a write calibrate command $C_0$-$C_7$ from controller 110 to memory device 120; where each $C_x$ represents an N-bit value carried by the C/A[0:N−1] links during one of the eight (8) unit intervals that make up the first packet interval. During the $P^{th}$ packet interval (where P is an integer greater than 1), the C/A[0:N−1] links are shown carrying write data $D_0$-$D_7$ being sent to memory device 120 from controller 110; where each $D_x$ represents an N-bit value carried by the C/A[0:N−1] links during one of the eight (8) unit intervals that make up the $P^{th}$ packet interval. This write data $D_0$-$D_7$ may be calibration patterns. During the $Q^{th}$ packet interval (where Q is an integer greater than P), the C/A[0:N−1] links are shown carrying resolved write data $R_0$-$R_7$ being sent from memory device 120 to controller 110; where each $R_x$ represents an N-bit value carried by the C/A[0:N−1] links during one of the eight (8) unit intervals that make up the $Q^{th}$ packet interval.

Figure 8B:
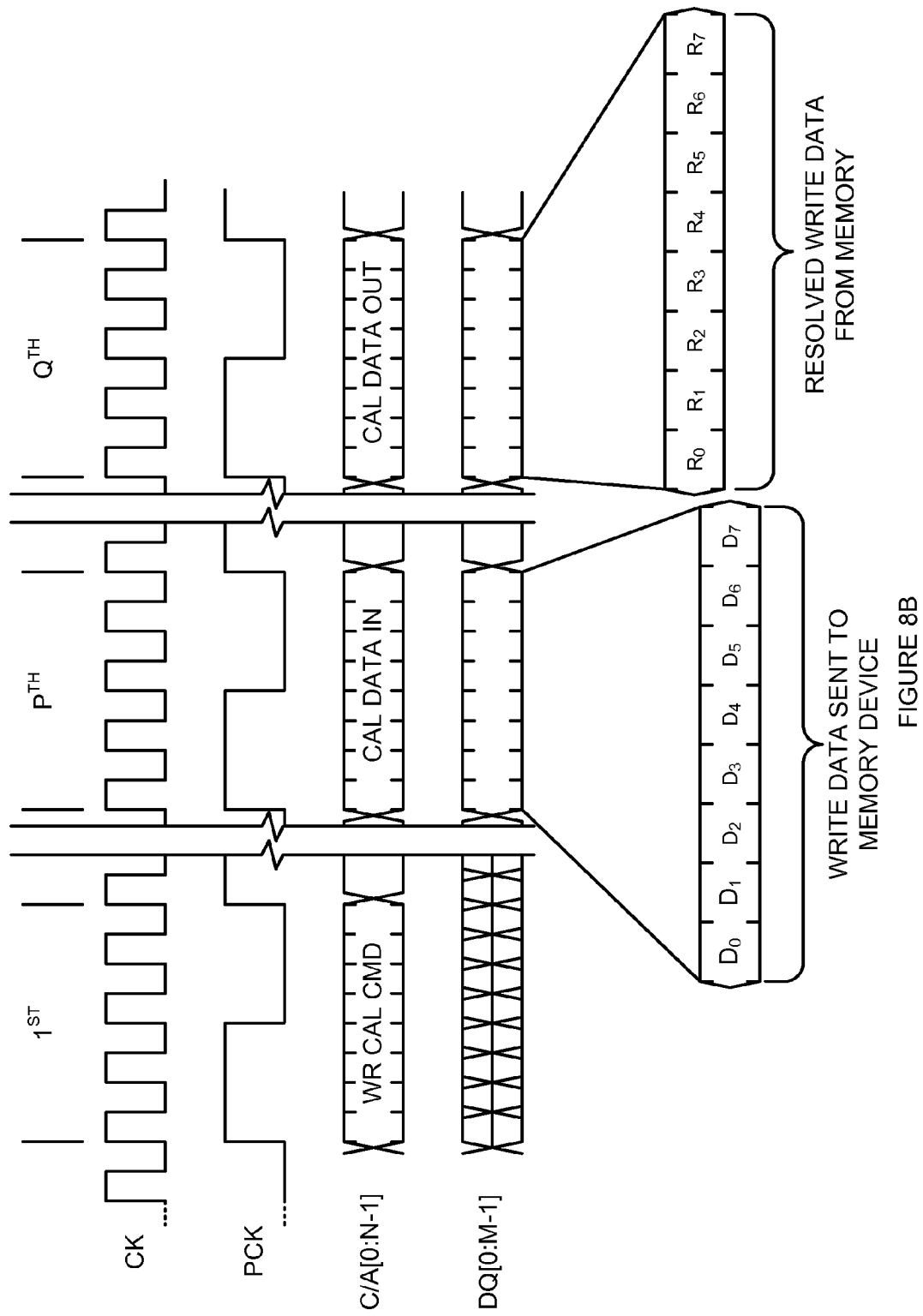
FIG. 8B is a timing diagram illustrating signals exchanged during a write calibration.

FIG. 8B is a timing diagram illustrating signals exchanged during a write calibration. FIG. 8B illustrates exemplary timing and signals exchanged during the processes which are further illustrated in FIG. 6 and FIG. 7. FIG. 8B is similar to FIG. 8A with the addition of signals exchanged on links DQ[0:M−1]. Thus, as in FIG. 8A, FIG. 8B shows a first timing reference CK is shown periodically toggling at a stable cycle period. Each phase of CK corresponds to one bit period (a.k.a., unit interval) on the C/A[0:N−1] links. A second timing reference PCK is a divided by four (4) version of CK. The rising edges of PCK define a packet interval In FIG. 8B, the C/A[0:N−1] links are shown from the perspective of memory device 120 receiving a write calibrate command from controller 110 during the first packet interval. During this first packet interval, the DQ[0:M−1] links are shown as unknown or don't care values. During the $P^{th}$ packet interval, the C/A[0:N−1] links are shown carrying calibration data to be received by memory device 120. Also during the $P^{th}$ packet interval, the DQ[0:M−1] links are shown carrying write data $D_0$-$D_7$ being sent to memory device 120 from controller 110; where each $D_x$ represents an M-bit value carried by the DQ[0:M−1] links during one of the eight (8) unit intervals that make up the $P^{th}$ packet interval. This write data $D_0$-$D_7$ may be calibration patterns. During the $Q^{th}$ packet interval, the C/A[0:N−1] links are shown carrying resolved calibration data being sent from memory device 120 to controller 110. Also during the $Q^{th}$ packet interval, the DQ[0:M−1] links are shown carrying resolved write data $R_0$-$R_7$ being sent from memory device 120 to controller 110; where each $R_x$ represents an M-bit value carried by the DQ[0:M−1] links during one of the eight (8) unit intervals that make up the $Q^{th}$ packet interval.

Figure 9:
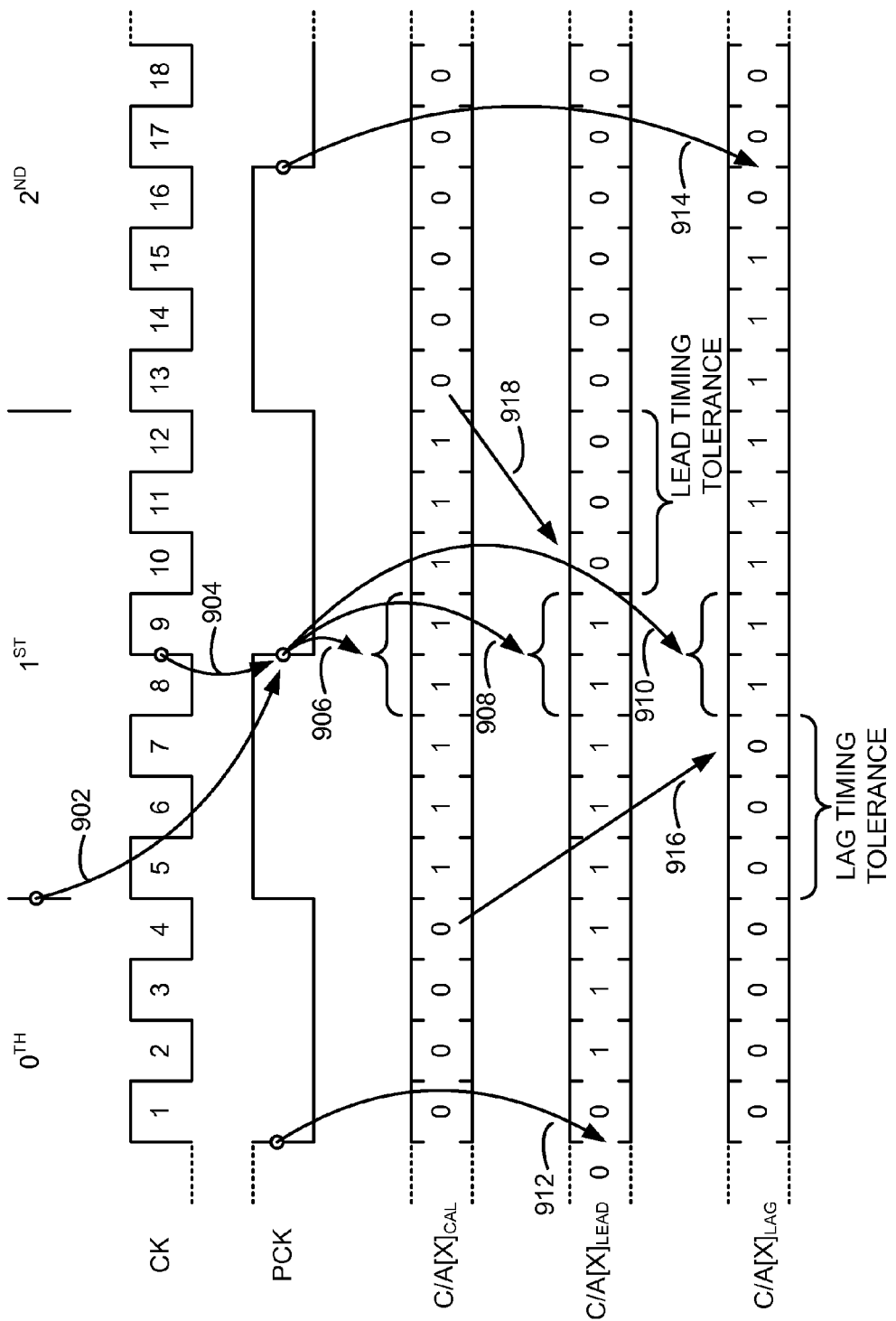
FIG. 9 is a timing diagram illustrating timing tolerances of a calibration command.

FIG. 9 is a timing diagram illustrating timing tolerances of a calibration command. For example, FIG. 9 may illustrate one or more signal values on C/A[0:N−1] associated with a command in the second command set (i.e., a second command set selected such that timing error(s) that are greater than one bit time of the C/A[0:N−1] links may exist and memory device 120 will still be able distinguish the commands of the second command set.)

In FIG. 9, a first timing reference CK is shown periodically toggling at a stable cycle period. Each phase of CK corresponds to one bit period on the C/A[0:N−1] links. Each phase of CK is numbered consecutively 1 through 18, starting with the number 1 on a logic high ("1") phase. A second timing reference PCK is a divided by four (4) version of CK. PCK starts in FIG. 9 with a falling edge corresponding the rising edge of CK that starts the #1 phase of CK. The rising edges of PCK define a packet interval. In other words, a command unit of a packet on the C/A[0:N−1] links is defined to be from a rising edge of PCK to the following rising edge of PCK—a time span of, equivalently, four (4) CK cycles, eight (8) CK phases, or eight (8) unit intervals.

A first packet interval begins in FIG. 9 with the rising edge of PCK that takes place in response to the rising edge of CK between the $4^{th}$ and $5^{th}$ CK phases. This first packet interval ends with the rising edge of PCK that takes place in response to the rising edge of CK between the $12^{th}$ and $13^{th}$ CK phases. Thus, the falling edge of PCK marks the middle of a packet interval. Arrow 902 illustrates that the falling edge of PCK marks the middle of the first packet interval. The falling edge of PCK that marks the middle of the first packet interval occurs in response to the rising edge of CK between the $8^{th}$ and $9^{th}$ CK phases. This is illustrated in FIG. 9 by arrow 904 running from the rising edge of CK between the $8^{th}$ and $9^{th}$ CK phases to the second falling edge of PCK.

In FIG. 9, an encoding of signal values on C/A[0:N−1] associated with two commands in the second command set is illustrated for a single signal (C/A[X]) of C/A[0:N−1] is illustrated. The first command is sent during the $0^{th}$ and $2^{nd}$ packet intervals, and a second command is sent during the $1^{st}$ packet interval.

The first command is encoded as all logic lows ("0"'s) for the duration of a packet interval. $C/A[X]_{CAL}$ represents the bit timing on an individual link of C/A[0:N−1] when it is calibrated. Thus, the $C/A[X]_{CAL}$ signal in FIG. 9 is shown as logic lows for CK phases 1-4 (i.e., during the $0^{th}$ packet interval), and 13-18 (i.e., during the $2^{nd}$ packet interval).

The second command is encoded as all logic highs ("1"'s) for the duration of a packet interval. Thus, $C/A[X]_{CAL}$ in FIG. 9 is shown as logic highs for CK phases 5-12 (i.e., during the $1^{th}$ packet interval.) To distinguish the first command from the second command, the receiving device (e.g., memory device 120) may examine only the signal values on C/A[X] that immediately surround the midpoint of a packet interval. This is illustrated by arrow 906. Received signal values of two "1'"s that surround the midpoint of the packet interval indicate the second command was sent. Received signal values of two "0'"s that surround the midpoint of the packet interval indicate the first command was sent. Because the two received signal values that surround the midpoint of the packet interval are used to differentiate the first command from the second command, the other bits (i.e., those nominally received during CK phases 5-7 and 10-12 of the $1^{st}$ packet interval, or CK phases 13-15 of the $2^{nd}$ packet interval) may be considered as guard bits.

A situation where the C/A[X] link is uncalibrated such that each command is received three unit intervals early is illustrated in FIG. 9 by C/A[X]$_{LEAD}$. The three unit interval lead is illustrated by arrow 918 showing the displacement of the start of the $2^{nd}$ C/A[X]$_{CAL}$ signal translated earlier in time by three unit intervals (from CK phase #13 to CK phase #10). As is illustrated by arrow 908, the receiving device will observe two "1'"s that surrounding the midpoint of a the first packet interval when the uncalibrated condition illustrated by C/A[X]$_{LEAD}$ exists. As is illustrated by arrow 912, the receiving device will observe two "0'"s surrounding the midpoint of a the $0^{th}$ packet interval when the uncalibrated condition illustrated by C/A[X]$_{LEAD}$ exists. Thus, even when the C/A[X] link is uncalibrated such that each command is received up three unit intervals early, the receiving device is able to recognize and distinguish these two commands of the second command set. It should be readily observed that if the C/A[X] link is uncalibrated such that each command is received more than three unit intervals early, the two commands of the second command set may be misinterpreted.

A situation where the C/A[X] link is uncalibrated such that each command is received three unit intervals late is illustrated in FIG. 9 by C/A[X]$_{LAG}$. The three unit interval lag is illustrated by arrow 916 showing the displacement of the end of the $0^{th}$ C/A[X]$_{CAL}$ signal translated later in time by three unit intervals (from CK phase #4 to CK phase #7). As is illustrated by arrow 910, the receiving device will observe two "1'"s that surrounding the midpoint of a the first packet interval when the uncalibrated condition illustrated by C/A[X]$_{LAG}$ exists. As is illustrated by arrow 914, the receiving device will observe two "0'"s surrounding the midpoint of a the $2^{nd}$ packet interval when the uncalibrated condition illustrated by C/A[X]$_{LEAD}$ exists. Thus, even when the C/A[X] link is uncalibrated such that each command is received up three unit intervals late, the receiving device is able to distinguish these two commands of the second command set. It should be readily observed that if the C/A[X] link is uncalibrated such that each command is received more than three unit intervals late, the two commands of the second command set may be improperly decoded and/or misinterpreted.

Figure 10:
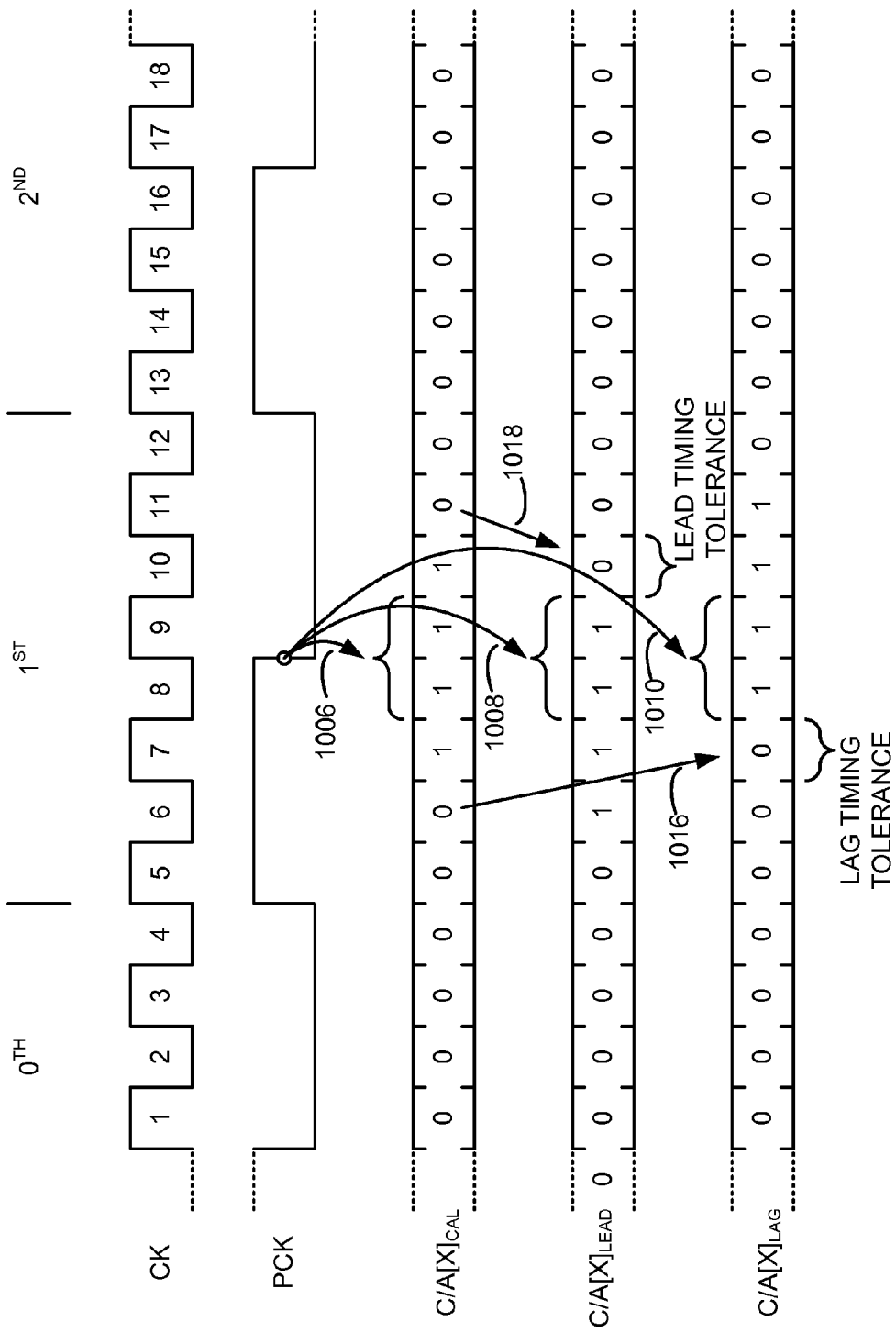
FIG. 10 is a timing diagram illustrating timing tolerances of a calibration command.

FIG. 10 is a timing diagram illustrating timing tolerances of a calibration command. For example, FIG. 10 may illustrate one or more signal values on C/A[0:N−1] associated with a command in the second command (i.e., a second command set selected such that timing error(s) that are greater than one bit time of the C/A[0:N−1] links may exist and memory device 120 will still be able distinguish the commands of the second command set.)

In FIG. 10, a first timing reference CK is shown periodically toggling at a stable cycle time. Like FIG. 9, each phase of CK corresponds to one bit period (a.k.a., unit interval) on the C/A[0:N−1] links. Each phase of CK is numbered consecutively 1 through 18, starting with the number 1 on a logic high ("1") phase. A second timing reference PCK is a divided by four (4) version of CK. PCK starts in FIG. 10 with a falling edge corresponding the rising edge of CK that starts the #1 phase of CK. The rising edges of PCK define a packet interval.

A first packet interval begins in FIG. 10 with the rising edge of PCK that takes place in response to the rising edge of CK between the $4^{th}$ and $5^{th}$ CK phases. This first packet interval ends with the rising edge of PCK that takes place in response to the rising edge of CK between the $12^{th}$ and $13^{th}$ CK phases. Thus, the falling edge of PCK marks the middle of a packet interval. The falling edge of PCK that marks the middle of the first packet interval occurs in response to the rising edge of CK between the $8^{th}$ and $9^{th}$ packet interval.

In FIG. 10, an encoding of signal values on C/A[0:N−1] associated with two commands in the second command set is illustrated for a single signal (C/A[X]) of C/A[0:N−1]. The first command is sent during the $0^{th}$ and $2^{nd}$ packet intervals and a second command is sent during the $1^{st}$ packet interval.

The first command is encoded as all logic lows ("0'"s) for the duration of a packet interval. C/A[X]$_{CAL}$ represents the bit timing on an individual link of C/A[0:N−1] when it is calibrated. Thus, the C/A[X]$_{CAL}$ signal in FIG. 10 is shown as logic lows for CK phases 1-4 (i.e., during the $0^{th}$ packet interval), and 13-18 (i.e., during the $2^{nd}$ packet interval).

The second command is encoded as two (2) logic lows ("0'"s), followed by four (4) logic highs ("1'"s), followed by two (2) logic lows ("0'"s). Thus, C/A[X]$_{CAL}$ in FIG. 9 is shown as logic lows for CK phase 5 and 6, highs for CK phases 7-10, and lows for CK phases 11 and 12. To distinguish the first command from the second command, the receiving device (e.g., memory device 120) may examine only the signal values on C/A[X] that immediately surround the midpoint of a packet interval. This is illustrated by arrow 1006. As with the encoding illustrated in FIG. 9, received signal values of two "1'"s that surround the midpoint of the packet interval indicate the second command was sent. Received signal values of two "0'"s that surround the midpoint of the packet interval indicate the first command was sent. Because the two received signal values that surround the midpoint of the packet interval are used to differentiate the first command from the second command, the other bits surrounding and matching those two bits that also are different between the first command and the second command (i.e., those nominally received during CK phases 7 and 10 of $1^{st}$ packet interval, or CK phases 15 and 18 of the $2^{nd}$ packet interval) may be considered as guard bits.

A situation where the C/A[X] link is uncalibrated such that each command is received one unit interval early is illustrated in FIG. 10 by C/A[X]$_{LEAD}$. The one unit interval lead is illustrated by arrow 1018 showing the displacement of the start of the $2^{nd}$ set of logic lows (those nominally received during CK phases 11 and 12) of the second command C/A[X]$_{CAL}$ signal translated earlier in time by one unit interval (from CK phase #11 to CK phase #10). As is illustrated by arrow 1008, the receiving device will still observe two "1'"s that surrounding the midpoint of a the first packet interval when the uncalibrated condition illustrated by C/A[X]$_{LEAD}$ exists. Thus, even when the C/A[X] link is uncalibrated such that each command is received one unit interval early, the receiving device is able to distinguish these two commands of this selected encoding of second command set. It should be readily observed that if the C/A[X] link is uncalibrated such that each command is received more than a unit intervals early, the two illustrated commands of the second command set may be improperly decoded and/or misinterpreted.

A situation where the C/A[X] link is uncalibrated such that each command is received one unit interval late is illustrated in FIG. 10 by C/A[X]$_{LAG}$. The one unit interval lead is illustrated by arrow 1016 showing the displacement of the start of the 1$^{st}$ set of logic lows (those nominally received during CK phases 5 and 6) of the second command C/A[X]$_{CAL}$ signal translated later in time by one unit interval (from CK phases #5 and #6 to CK phases #6 and #7, respectively). As is illustrated by arrow 1010, the receiving device will still observe two "1"'s that surrounding the midpoint of a the first packet interval when the uncalibrated condition illustrated by C/A[X]$_{LAG}$ exists. Thus, even when the C/A[X] link is uncalibrated such that each command is received one unit interval late, the receiving device is able to distinguish these two commands of this selected encoding of second command set. It should be readily observed that if the C/A[X] link is uncalibrated such that each command is received more than a unit interval late, the two illustrated commands of the second command set may be misinterpreted.

Figure 11:
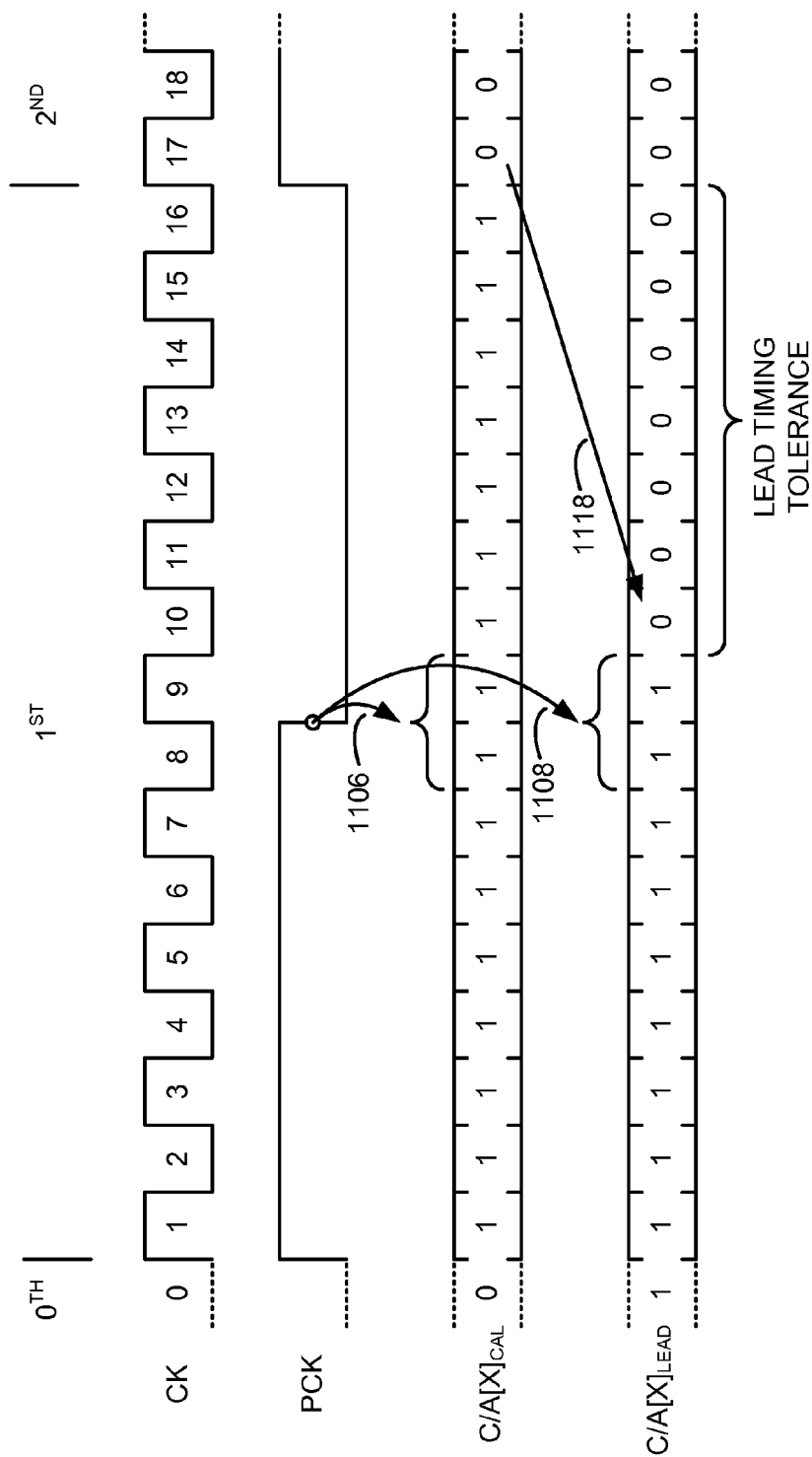
FIG. 11 is a timing diagram illustrating timing tolerances of a calibration command with alternate packet timing.

FIG. 11 is a timing diagram illustrating timing tolerances of a calibration command with alternate packet timing. For example, FIG. 11 may illustrate one or more signal values on C/A[0:N−1] associated with a command in the second command (i.e., a second command set selected such that timing error(s) that are greater than three bit times of the C/A[0:N−1] links may exist and memory device 120 will still be able distinguish the commands of the second command set.)

In FIG. 11, a first timing reference CK is shown periodically toggling at a stable cycle period. Like FIG. 9 and FIG. 10, each phase of CK corresponds to one unit interval on the C/A[0:N−1] links. Each phase of CK is numbered consecutively 0 through 18, starting with the number 0 on a logic low ("0") phase. A second timing reference PCK is a divided by eight (8) version of CK. This should be contrasted with FIG. 9 and FIG. 10 where PCK was a divided by four version of CK. Thus, the packet interval illustrated in FIG. 11 may be referred to as a 2-times or 2× packet interval because is twice the length (or time) of a normal packet interval. Likewise, if an alternately timed packet interval were to be 3-times (3×), or 4-times (4×) the length of a normal packet interval, it may be referred to as a 3× or 4× packet interval, respectively. In FIG. 11, PCK starts with a rising edge corresponding to the rising edge of CK that starts the #1 phase of CK. The rising edges of PCK in FIG. 11 define a 2× packet interval.

A first packet interval begins in FIG. 11 with the rising edge of PCK that takes place in response to the rising edge of CK between the 0$^{th}$ and 1$^{st}$ CK phases. This first packet interval ends with the rising edge of PCK that takes place in response to the rising edge of CK between the 16$^{th}$ and 17$^{th}$ CK phases. Thus, as in FIG. 9 and FIG. 10, the falling edge of PCK marks the middle of a packet interval even though PCK defines a 2× packet interval. The falling edge of PCK that marks the middle of the first packet interval occurs in response to the rising edge of CK between the 8$^{th}$ and 9$^{th}$ packet interval.

In FIG. 11, an encoding of signal values on C/A[0:N−1] associated with two commands in the second command set is illustrated for a single signal (C/A[X]) of C/A[0:N−1]. The first command is sent during the 0$^{th}$ and 2$^{nd}$ packet intervals and a second command is sent during the 1$^{st}$ packet interval.

The first command is encoded as all logic lows ("0"'s) for the duration of an alternately timed packet interval (a.k.a. 2× packet interval). C/A[X]$_{CAL}$ represents the bit timing on an individual link of C/A[0:N−1] when it is calibrated. Thus, the C/A[X]$_{CAL}$ signal in FIG. 11 is shown as logic lows for CK phase 0 (i.e., during the 0$^{th}$ 2× packet interval), and CK phases 17 and 18 (i.e., during the 2$^{nd}$ 2× packet interval).

The second command is encoded as all logic highs ("1"'s for the duration of an 2× packet interval. Thus, C/A[X]$_{CAL}$ in FIG. 11 is shown as logic highs for CK phases 1 through 16. To distinguish the first command from the second command, the receiving device may examine only the signal values on C/A[X] that immediately surround the midpoint of a 2× packet interval. This is illustrated by arrow 1106. As with the encoding illustrated in FIG. 9 and FIG. 10, received signal values of two "1"'s that surround the midpoint of the 2× packet interval indicate the second command was sent. Received signal values of two "0"'s that surround the midpoint of the 2× packet interval indicate the first command was sent.

A situation where the C/A[X] link is uncalibrated such that each command is received seven unit intervals early is illustrated in FIG. 11 by C/A[X]$_{LEAD}$. The seven unit interval lead is illustrated by arrow 1118 showing the displacement of the start of the 2$^{nd}$ set of logic lows (those nominally received during CK phases 17 and 18) of the second command C/A [X]$_{CAL}$ signal translated earlier in time by seven unit intervals (from CK phase #17 to CK phase #10). As is illustrated by arrow 1108, the receiving device will still observe two "1"'s that surrounding the midpoint of a the first 2× packet interval when the uncalibrated condition illustrated by C/A[X]$_{LEAD}$ exists. Thus, even when the C/A[X] link is uncalibrated such that each command is received seven unit intervals early, the receiving device is able to distinguish these two commands of this selected encoding of second command set. It should be readily observed that if the C/A[X] link is uncalibrated such that each command is received more than seven unit intervals early, the two illustrated commands of the second command set may be improperly decoded and/or misinterpreted for each other. Accordingly, it should be understood that by selecting a second command made up of commands that are based on an alternately timed packet interval (e.g., 2×, 3×, 4×, etc.), a command set may be selected that can tolerate an arbitrarily large amount of mis-calibration. It should also be noted that although FIG. 11 is illustrated in terms of commands that are received seven unit intervals early, the same principles shown in FIG. 9 and FIG. 10 apply and a command set selected based on an alternately timed packet interval can tolerate commands that are received seven unit intervals late.

Figure 12:
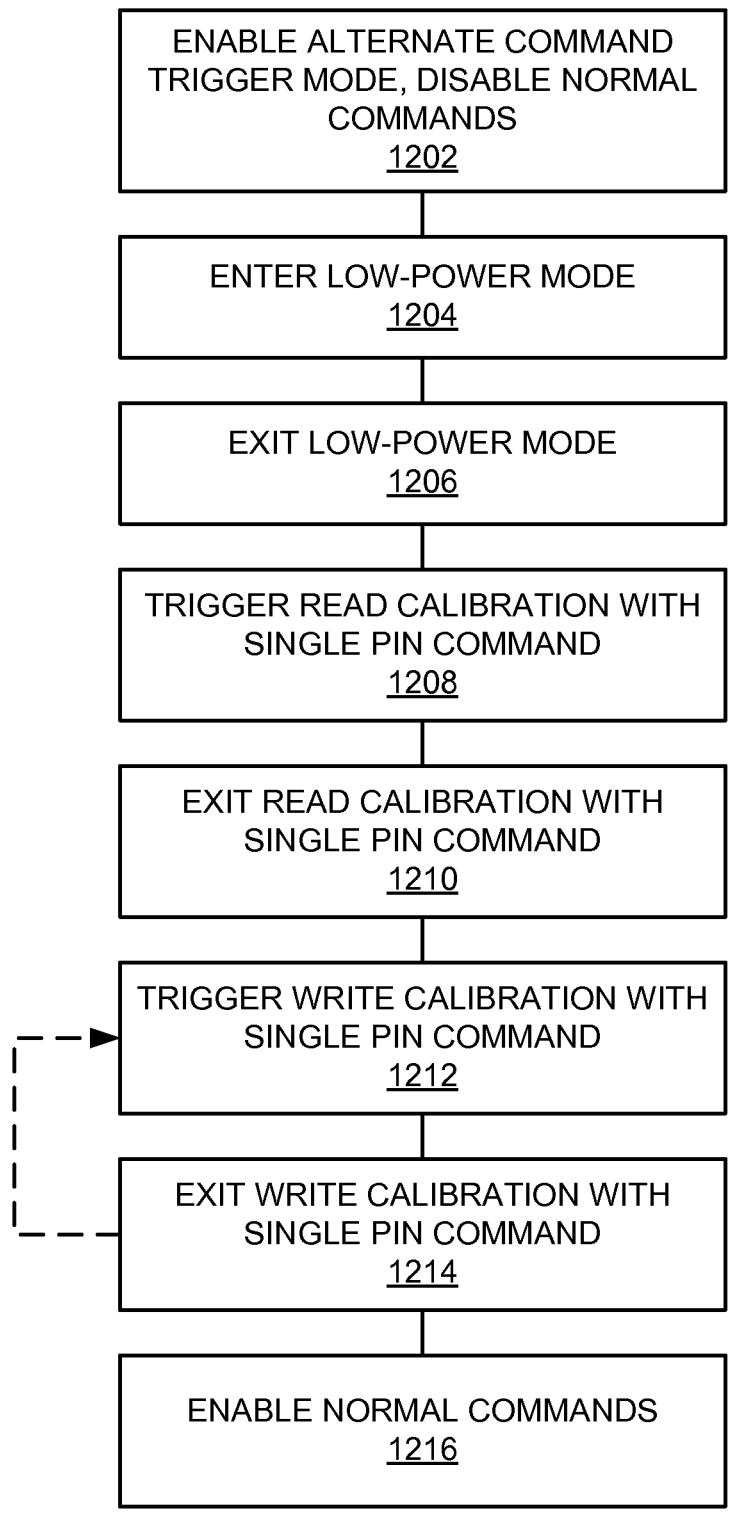
FIG. 12 is a flowchart illustrating a method of calibrating.

FIG. 12 is a flowchart illustrating a method of calibrating. The steps illustrated in FIG. 12 may be performed by one or more elements of memory system 100. For example, the steps illustrated in FIG. 12 may be part of an intermediate calibration sequence performed by memory system 100. In another example, the steps illustrated in FIG. 12 may be part of an intermediate calibration sequence.

An alternate command trigger mode is entered and normal commands are disabled (1202). For example, controller 110 may cause memory device 120 to enable a second set of commands (and disable the first set of commands). At least one of these second set of commands may be sent (and received) using a single pin (i.e., a single one of C/A[0:N−1]) to cause memory device 120 to perform an action. In addition, each command that may be sent using only a single pin is typically tied to a single pin. In other words, the second command set may have certain commands that are triggered by a certain state, transition, or bit pattern on a particular one of C/A[0:N−1]. Because the certain state, transition, or bit pattern on a single pin may trigger a command, these pins are typically dedicated to a respective command Thus, the pin is said to "trigger" the action associated with the command. As discussed herein, the certain state, transition, or bit pattern on one of these dedicated trigger pins may be configured to be reliably received at a specified full-speed link rate even though links C/A[0:N−1] have drifted out of calibration.

A low-power mode is entered (1204). For example, memory system 100 may save power by synchronously pausing one or more clocks that are distributed through one or more respective clock distribution networks. This may turn off clocks to circuitry in both controller 110 and memory device 120. Controller 110 may instruct memory device 120 to enter one of the low-power states described herein. Controller 110 may instruct memory device 120 to enter one of the low-power states via one or more MODE signals.

The low-power mode is exited (1206). For example, memory system 100 may restart the one or more clock distribution networks paused previously. This will turn on clocks to circuitry in both controller 110 and memory device 120. Controller 110 may instruct memory device 120 to enter the active state described herein. Controller 110 may instruct memory device 120 to enter the active state via one or more MODE signals.

A read calibration is triggered with a single pin command (1208). For example, a read calibration sequence may be triggered on memory device 120 by a command in the second command set received on a single pin. The other C/A[0:N−1] links may be held in a certain state, or ignored. As discussed herein, a read calibration may involve steps to ensure signals sent by a memory device are received reliably, at a specified link rate, by a controller.

The read calibration is exited with a single pin command (1210). For example, memory device 120 may exit a read calibration sequence in response to a command in the second command set received on a single pin. This pin may be a different pin than the one that triggered the read calibration sequence. This pin may be the same pin that triggered the read calibration sequence, but involves a different state, state, transition, or bit pattern than what triggered the read calibration sequence in box 1208.

A write calibration is triggered with a single pin command (1212). For example, a write calibration sequence may be triggered on memory device 120 by a command in the second command set received on a single pin. The other C/A[0:N−1] links may be held in a certain state, or ignored. As discussed herein, a write calibration may involve steps to ensure signals sent by controller 110 are received reliably by memory device 120 at a specified link rate.

The write calibration is exited with a single pin command (1214). For example, memory device 120 may exit a write calibration sequence in response to a command in the second command set received on a single pin. This pin may be a different pin than the one that triggered the read calibration sequence, triggered the exit of the read calibration sequence, or triggered the start of the write calibration sequence. This pin may be the same pin that triggered the write calibration sequence, but involves a different state, state, transition, or bit pattern than what triggered the write calibration sequence in box 1212. Boxes 1212 and 1214 may be repeated multiple times to complete and entire write calibration sequence.

Normal commands are enabled (1216). For example, the trigger mode may be exited, and normal commands enabled on memory device 120 by a command in the second command set received on a single pin. The other C/A[0:N−1] links may be held in a certain state, or ignored. In another example, normal commands may be enable in response to the operation in box 1214.

Figure 13:
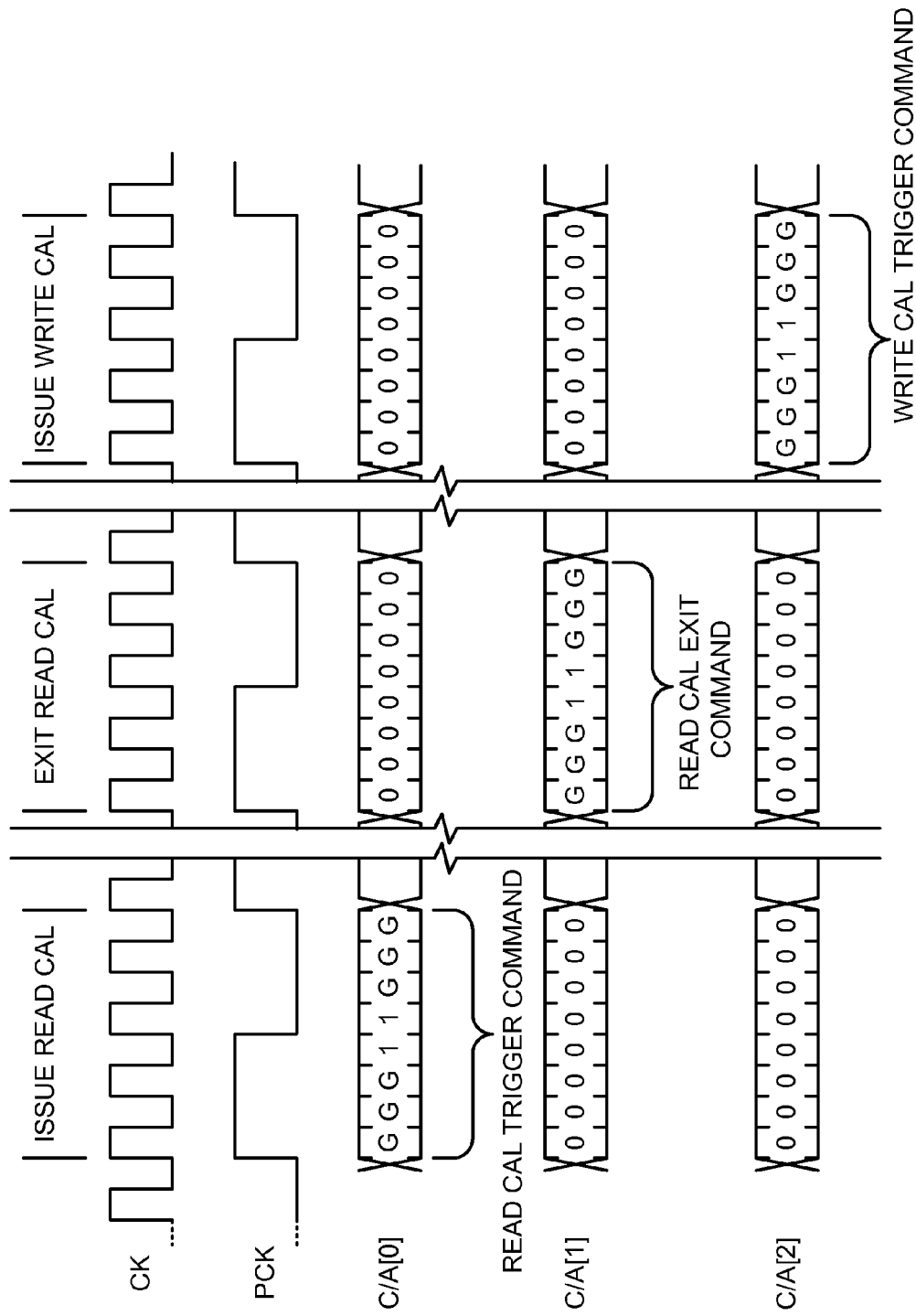
FIG. 13 is a timing diagram illustrating calibration commands with timing guard bits.

FIG. 13 is a timing diagram illustrating calibration commands with timing guard bits. FIG. 13 also illustrates example single pin trigger commands. In FIG. 13, a read calibration command is issued by sending two logic highs ("1"'s) on C/A[0] during the CK phases that immediately surround the midpoint of a first packet interval (labeled "issue read cal"). The other logic levels sent during the other CK phases of the "issue read cal" packet interval are labeled "G" to indicate they may be set to logic highs ("1"'s) and thus act as guard bits. During the "issue read cal" packet interval, C/A[1] and C/A[2] are logic lows ("0"'s).

The read calibration command is exited by sending two logic highs ("1"'s) on C/A[1] during the CK phases that immediately surround the midpoint of a second packet interval (labeled "exit read cal"). The other logic levels sent during the other CK phases of the second packet interval are labeled "G" to indicate they may be set to logic highs ("1"'s) and thus act as guard bits. During the "exit read cal" packet interval, C/A[0] and C/A[2] are logic lows ("0"'s).

A write calibration command is issued by sending two logic highs ("1"'s) on C/A[2] during the CK phases that immediately surround the midpoint of a third packet interval (labeled "issue write cal"). The other logic levels sent during the other CK phases of the third packet interval are labeled "G" to indicate they may be set to logic highs ("1"'s) and thus act as guard bits. During the "issue write cal" packet interval, C/A[0] and C/A[1] are logic lows ("0"'s). It should be understood that multiple issue write calibration commands may be sent on C/A[2] in order to perform an intermediate write calibration sequence. The write calibration command may exited by sending two logic highs ("1"'s) on a C/A link during the CK phases that immediately surround the midpoint of a fourth packet interval (not shown in FIG. 13). During the "exit write cal" packet interval, C/A[0], C/A[1], and C/A[2] are logic lows ("0"'s). Each of these write calibration commands may be part of the sequences discussed in FIG. 6 and FIG. 7 and further illustrated in FIG. 8A and FIG. 8B. The issue write calibration commands sent on C/A[2] may correspond to the "write calibrate command" illustrated in FIG. 8A and FIG. 8B.

The systems and devices described above may be implemented in computer systems, or stored by computer systems. The systems described above may also be stored on a computer readable medium. Devices, circuits, and systems described herein may be implemented using computer-aided design tools available in the art, and embodied by computer-readable files containing software descriptions of such circuits. This includes, but is not limited to one or more elements of memory system 100 and its components. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 14:
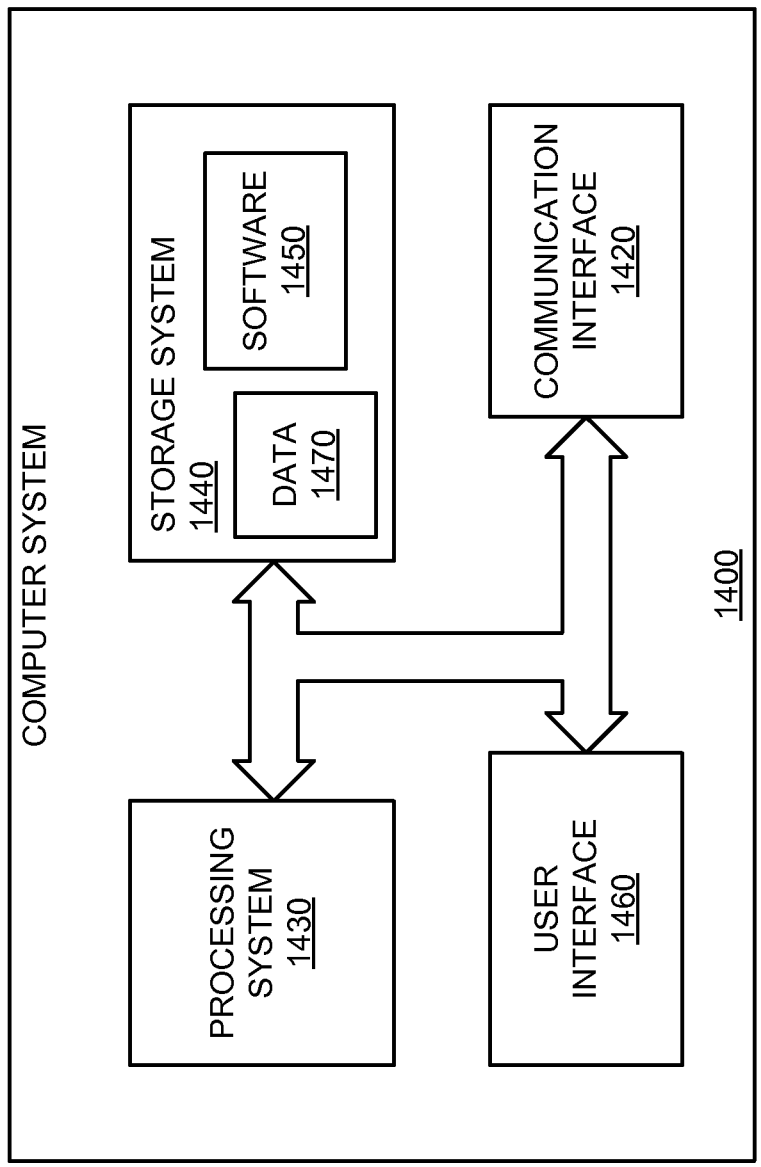
FIG. 14 is a block diagram illustrating a computer.

FIG. 14 illustrates a block diagram of a computer system. Computer system 1400 includes communication interface 1420, processing system 1430, storage system 1440, and user interface 1460. Processing system 1430 is operatively coupled to storage system 1440. Storage system 1440 stores software 1450 and data 1470. Computer system 1400 may include memory system 100. Processing system 1430 is operatively coupled to communication interface 1420 and user interface 1460. Computer system 1400 may comprise a programmed general-purpose computer. Computer system 1400 may include a microprocessor. Computer system 1400 may comprise programmable or special purpose circuitry. Computer system 1400 may be distributed among multiple devices, processors, storage, and/or interfaces that together comprise elements 1420-1470.

Communication interface 1420 may comprise a network interface, modem, port, bus, link, transceiver, or other communication device. Communication interface 1420 may be distributed among multiple communication devices. Processing system 1430 may comprise a microprocessor, microcontroller, logic circuit, or other processing device. Processing system 1430 may be distributed among multiple processing devices. User interface 1460 may comprise a keyboard, mouse, voice recognition interface, microphone and speakers, graphical display, touch screen, or other type of user interface device. User interface 1460 may be distributed among multiple interface devices. Storage system 1440 may comprise a disk, tape, integrated circuit, RAM, ROM, EEPROM, flash memory, network storage, server, or other memory function. Storage system 1440 may include computer readable medium. Storage system 1440 may be distributed among multiple memory devices.

Processing system 1430 retrieves and executes software 1450 from storage system 1440. Processing system 1430 may retrieve and store data 1470. Processing system 1430 may also retrieve and store data via communication interface 1420. Processing system 1430 may create or modify software 1450 or data 1470 to achieve a tangible result. Processing system 1430 may control communication interface 1420 or user interface 1460 to achieve a tangible result. Processing system 1430 may retrieve and execute remotely stored software via communication interface 1420.

Software 1450 and remotely stored software may comprise an operating system, utilities, drivers, networking software, and other software typically executed by a computer system. Software 1450 may comprise an application program, applet, firmware, or other form of machine-readable processing instructions typically executed by a computer system. When executed by processing system 1430, software 1450 or remotely stored software may direct computer system 1400 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of operating a memory device, comprising:
   receiving commands at a first link rate;
   receiving a first indicator to redefine a command set from a first command set to a second command set, the second command set configured to include guard bits that allow the second command set to be reliably received at the first link rate with greater timing error than the first command set is configured to be reliably received at the first link rate.

2. The method of claim 1, further comprising:
   sending resolved calibration data.

3. The method of claim 2, wherein the resolved calibration data is sent at the first link rate.

4. The method of claim 1, wherein an encoding of the second command set has guard bits that are sent both before and after a midpoint of a packet interval.

5. The method of claim 1, wherein the second command set communicates a subset of commands communicated by the first command set.

6. The method of claim 1, wherein the second command set communicates a single command associated with calibrating a link used to receive commands.

7. The method of claim 1, further comprising:
   receiving a second indicator using the second command set.

8. The method of claim 7, further comprising:
   in response to the second indicator, receiving calibration data at the first link rate.

9. A method of operating a memory controller, comprising:
   sending commands at a first link rate;
   sending a first indicator to redefine a command set from a first command set to a second command set, the second command set configured to include guard bits that allow the second command set to be reliably received at the first link rate with greater timing error than the first command set is configured to be reliably received at the first link rate;
   sending a second indicator using the second command set; and,
   sending calibration data at the first link rate following the sending of the second indicator.

10. The method of claim 9, further comprising:
    receiving resolved calibration data.

11. The method of claim 10, wherein the resolved calibration data is received at the first link rate.

12. The method of claim 9, wherein an encoding of the second command set has guard bits that are sent both before and after a midpoint of a packet interval.

13. The method of claim 9, wherein the second command set communicates a subset of commands communicated by the first command set.

14. The method of claim 9, wherein the second command set communicates a single command associated with calibrating a link used to receive commands.

15. A method of operating an integrated circuit, comprising:
    receiving a first command on a first plurality of signal lines, the first command selected from a first encoding of commands, the first encoding of commands relying on a first signal timing tolerance of signals received on the first plurality of signal lines to distinguish at least two commands of the first encoding of commands from each other;
    receiving a first indicator;
    based on receiving the first indicator, entering a mode whereby the first encoding of commands is disabled and a second encoding of commands is enabled;
    receiving a second command on at least one of the first plurality of signal lines, the second command selected from the second encoding of commands, the second encoding of commands relying on a second signal timing tolerance of signals received on the first plurality of signal lines to distinguish at least two commands of the second encoding of commands from each other, the second signal timing tolerance being greater than the first signal timing tolerance, the second encoding of commands including guard bits that allow the second encoding of commands to be reliably received with the second signal timing tolerance; and,
    based on receiving the second command, transmitting calibration data.

16. The method of claim 15, wherein the transmitted calibration data is based on resolved signal values received in response to the second command.

17. The method of claim 15, further comprising:
before receiving the second command, transmitting a calibration pattern.

18. The method of claim 15, wherein the second command indicates the integrated circuit is to perform steps to calibrate timing of signals sent to the integrated circuit.

19. The method of claim 15, further comprising:
before receiving the second command, receiving a command to exit a low-power mode of operation.

20. The method of claim 15, wherein the indicator is received using the first plurality of signal lines.

21. The method of claim 15, wherein the indicator is received using a second plurality of signal lines.

22. A method of operating an integrated circuit, comprising:
sending a first command on a first plurality of signal lines, the first command selected from a first encoding of commands, the first encoding of commands relying on a first signal timing tolerance to be received on the first plurality of signal lines and distinguish at least two commands of the first encoding of commands from each other;
sending an indicator to use a second encoding of commands;
sending a second command on at least one of the first plurality of signal lines, the second command selected from the second encoding of commands, the second encoding of commands relying on a second signal timing tolerance to be received on the first plurality of signal lines and distinguish at least two commands of the second encoding of commands from each other, the second signal timing tolerance being greater than the first signal timing tolerance, the second encoding of commands including guard bits that allow the second encoding of commands to be reliably received with the second signal timing tolerance; and,
receiving calibration data sent based on the second command.

23. The method of claim 22, wherein the received calibration data is based on resolved signal values received in response to the second command.

24. The method of claim 22, further comprising:
receiving a calibration pattern sent before receiving the second command.

25. The method of claim 22, wherein the second command indicates a second integrated circuit is to perform steps to calibrate timing of signals sent to the second integrated circuit.

26. The method of claim 22, further comprising:
sending a command to exit a low-power mode of operation before sending the second command.

27. The method of claim 22, wherein the indicator is sent using the first plurality of signal lines.

28. The method of claim 22, wherein the indicator is sent using a second plurality of signal lines.

29. A method of controlling an integrated circuit, comprising:
sending commands on a bus using a first encoding, the first encoding specified with a first timing tolerance to be received reliably;
sending a first indicator that instructs a second encoding to be used, the second encoding specified to include guard bits that allow the second encoding to be received reliably with a second timing tolerance that is greater than the first timing tolerance; and,
sending a first calibration command using the second encoding; and,
receiving calibration data sent in response to the first calibration command.

30. The method of claim 29, further comprising:
after sending the first indicator that instructs a second encoding to be used, sending a second indicator to instruct the integrated circuit to enter a first low-power mode of operation.

31. The method of claim 30, further comprising:
after sending the second indicator, entering a second low-power mode of operation.

32. The method of claim 31, further comprising:
exiting the second low-power mode of operation; and,
after exiting the second low-power mode of operation, sending a third indicator to instruct the integrated circuit to exit the first low-power mode of operation.

33. The method of claim 29, further comprising:
in response to received calibration data, adjusting a timing of at least one signal of the bus.

34. The method of claim 29, wherein the first indicator is sent on a second bus.

35. The method of claim 29, wherein the first indicator is sent on the bus.

36. A memory device, comprising:
a plurality of receivers for receiving commands;
a storage element to output a first indicator to select a first decoding of a first plurality of commands to be received by the plurality of receivers the command bus and a second decoding of a second plurality of commands to be received by the plurality of receivers, the second decoding ignoring guard bits such that the second decoding is capable of being received correctly with a timing tolerance that is greater than one bit time of the plurality of receivers; and,
a first receiver of the plurality of receivers, to receive a command of the second plurality of commands that initiates a calibration sequence to reduce a timing error of the plurality of receivers to less than one bit time of the plurality of receivers.

37. The memory device of claim 36, wherein the first indicator is set to select the second decoding in preparation for the memory device entering low-power operation.

38. The memory device of claim 36 wherein the first indicator is set in response to a second command received by the plurality of receivers.

39. The memory device of claim 36, wherein the first indicator is set in response to a second command received by a second plurality of receivers.

40. A memory controller, comprising:
a first indicator to select an encoding of signals to be sent by a plurality of transmitters; and,
a first encoder to encode a calibration command with a first encoding, the calibration command to be sent by a plurality of transmitters when the by a plurality of transmitters are operating in the calibration mode, the first encoding of the calibration command including guard bits, the first encoding of the calibration command selected to enable the calibration command to be received by a device having receivers that are uncalibrated by more than one bit time of the transmission rate of the plurality of transmitters.

41. The memory controller of claim 40, further comprising:
a transmitter to send a second indicator to enable a memory device to respond to the first encoding.

42. The memory controller of claim 41, wherein the second indicator to be sent by one of the plurality of transmitters.

43. The memory controller of claim 41, wherein the second indicator is to be sent by a second plurality of transmitters.

44. A system, comprising:
- a memory controller to send commands at a first link rate, to send a first indicator to redefine a command set from a first command set to a second command set, and to send a second indicator using the second command set; and,
- a memory device to receive the first indicator and the second indicator, the second command set configured to include guard bits that allow the second command set to be reliably received at the first link rate with greater timing error than the first command set is configured to be reliably received at the first link rate, and to, in response to the second indicator, receive calibration data from the memory controller at the first link rate.

45. The system of claim 44, wherein the memory device sends resolved calibration data to the memory controller.

46. The system of claim 44, wherein the memory device sends resolved calibration data to the memory controller at the first link rate.

47. The system of claim 44, wherein an encoding of the second command set has guard bits that are sent both before and after a midpoint of a packet interval.

48. The system of claim 44, wherein the second command set communicates a subset of commands communicated by the first command set.

49. The system of claim 44, wherein the second command set communicates a single command associated with calibrating a link used to receive commands.

* * * * *